US010775616B1

(12) United States Patent
Ouderkirk et al.

(10) Patent No.: US 10,775,616 B1
(45) Date of Patent: Sep. 15, 2020

(54) LENSES INTEGRATED WITH MICRO-LIGHT EMITTING DIODES

(71) Applicant: Facebook Technologies, LLC, Menlo Park, CA (US)

(72) Inventors: Andrew John Ouderkirk, Redmond, WA (US); Patrick Joseph Hughes, Cork (IE); Pooya Saketi, Cork (IE); Robin Sharma, Redmond, WA (US); Celine Claire Oyer, Cork (IE); James Ronald Bonar, Erskine (GB)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/927,963

(22) Filed: Mar. 21, 2018

(51) Int. Cl.

| | |
|---|---|
| ***G02B 27/00*** | (2006.01) |
| ***H01L 25/075*** | (2006.01) |
| ***H01L 33/62*** | (2010.01) |
| ***G06F 3/01*** | (2006.01) |
| *H01L 33/10* | (2010.01) |
| *H01L 33/24* | (2010.01) |

(52) U.S. Cl.
CPC ......... *G02B 27/0093* (2013.01); *G06F 3/013* (2013.01); *H01L 25/0753* (2013.01); *H01L 33/62* (2013.01); *H01L 33/10* (2013.01); *H01L 33/24* (2013.01); *H01L 2933/0066* (2013.01)

(58) Field of Classification Search
CPC combination set(s) only.
See application file for complete search history.

(56) References Cited

U.S. PATENT DOCUMENTS

| | | | |
|---|---|---|---|
| 2003/0231293 | A1 | 12/2003 | Blum et al. |
| 2009/0219258 | A1 | 9/2009 | Geaghan et al. |
| 2012/0050682 | A1 | 3/2012 | Bonnin et al. |
| 2013/0114850 | A1 | 5/2013 | Publicover et al. |
| 2014/0354953 | A1 | 12/2014 | Chen et al. |
| 2015/0169050 | A1 | 6/2015 | Publicover et al. |
| 2016/0379606 | A1 | 12/2016 | Kollin et al. |

(Continued)

FOREIGN PATENT DOCUMENTS

| | | | |
|---|---|---|---|
| EP | 2 226 703 | A2 | 9/2010 |
| WO | WO 2017/186320 | A1 | 11/2017 |

OTHER PUBLICATIONS

PCT International Search Report and Written Opinion, PCT Application No. PCT/US2018/051595, dated May 21, 2019, 17 pages.

(Continued)

*Primary Examiner* — Robin J Mishler
(74) *Attorney, Agent, or Firm* — Fenwick & West LLP

(57) ABSTRACT

A lens assembly includes a plurality of micro-LEDs coupled to one or more circuitries affixed to a surface of a lens substrate. At least one micro-LED is positioned within a viewing region of the lens substrate. The viewing region is a region through which light emitted by an electronic display passes prior to reaching an eyebox. The lens assembly may be part of a head-mounted display (HMD). An eye tracking unit of the HMD includes the one or more micro-LEDs to project light onto a portion of a user's eye and a detector to collect reflected and/or scattered light from the illuminated portion of the eye. The eye tracking unit tracks the movement of the user's eye. Based on the tracked movement, the HMD adjusts presentation of displayed content such as focus and/or resolutions of the displayed content.

20 Claims, 12 Drawing Sheets

(56) References Cited

U.S. PATENT DOCUMENTS

2017/0038834 A1* 2/2017 Wilson .................... G06T 7/215
2017/0115519 A1 4/2017 Shi et al.
2017/0116476 A1* 4/2017 Publicover ......... G06K 9/00604
2017/0205876 A1 7/2017 Vidal et al.
2017/0255011 A1 9/2017 Son et al.

OTHER PUBLICATIONS

Extended European Search Report, European Application No. 19159199.9, dated Sep. 20, 2019, 7 pages.
United States Office Action, U.S. Appl. No. 16/106,555, dated Dec. 2, 2019, 20 pages.

* cited by examiner

LENSES INTEGRATED WITH MICRO-LIGHT EMITTING DIODES

BACKGROUND

The present disclosure generally relates to eye face tracking systems, and specifically relates to eye tracking systems that include micro-LEDs.

Eye tracking systems track imaging light reflected off different regions of eyes thereby to track viewers' points of attention. For example, light reflected off corneas is used to track positions of eyes and reflected off irises is used to track positions of pupils. However, it is challenging to accurately track the users' points of attention. As one example, some users have small eye area which limits the cornea and/or iris area that can be imaged. As another example, it is difficult to accurately estimate gaze direction in systems with a wide field of view because several glint sources are needed to generate light necessary for tracking the positions of the eyes over a wide range of angles.

Glint sources generating light for tracking the positions of the eyes are typically placed at the periphery of viewing optics that are outside the field of view of imaging displays. However, this limits the performance and accuracy of eye tracking systems, particularly for cases where the view of the users' eyes is limited or where the eyes are tracked over a wide range of angles.

SUMMARY OF THE DISCLOSURE

Described herein are optical elements that are integrated with light sources such as micro-LEDs for tracking movement of eyes or faces. Light emitted by the light sources is reflected and/or scattered by a user's eye. The reflected and/or scattered light is detected and used for tracking movement of the user's eye or face. The optical elements described herein can be used for accurately tracking eye or face movement without compromising image quality.

One example of such an optical element is a lens assembly that includes multiple micro-LEDs coupled to one or more circuitries affixed to a first surface of a lens substrate and the lens substrate. At least one of the multiple micro-LEDs is positioned within a viewing region of the lens substrate. The viewing region is a region through which light emitted by an electronic display passes and reaches an eyebox. The first surface may have a surface profile that is flat, curved (e.g., concave, convex, etc.), freeform, or some combination thereof. The one or more circuitries supply electrical current to the one or more micro-LEDs. The one or more micro-LEDs are coupled to the one or more circuitries. The one or more micro-LEDs emit light to illuminate a portion of the user's eye. The one or more micro-LEDs can be a part of an eye tracking unit. The eye tracking unit may further include a detector to collect reflected and/or scattered light from the portion of the eye illuminated by the light emitted by the one or more micro-LEDs. The lens assembly and/or the eye tracking unit can be included in a head-mounted display (HMD) that presents content to the user.

Described herein is a method of manufacturing an optical element (e.g., a lens assembly) including one or more light sources such as a micro-LED coupled to a lens substrate. Micro-LEDs dies are fabricated on wafers. A lens substrate including a lens integrated with one or more circuitries is fabricated. A pick and place head (PPH) picks up one or more micro-LED dies, aligns the one or more micro-LED dies to the lens substrate, and places the one or more micro-LED dies onto the lens substrate. Bonding forces such as a thermal compression force is applied to permanently bond the one or more micro-LED dies to the lens substrate. A clear coating may be further applied over the one or more micro-LED dies and the lens substrate to at least partially enclosing the one or more micro-LED dies.

Figure 1A:
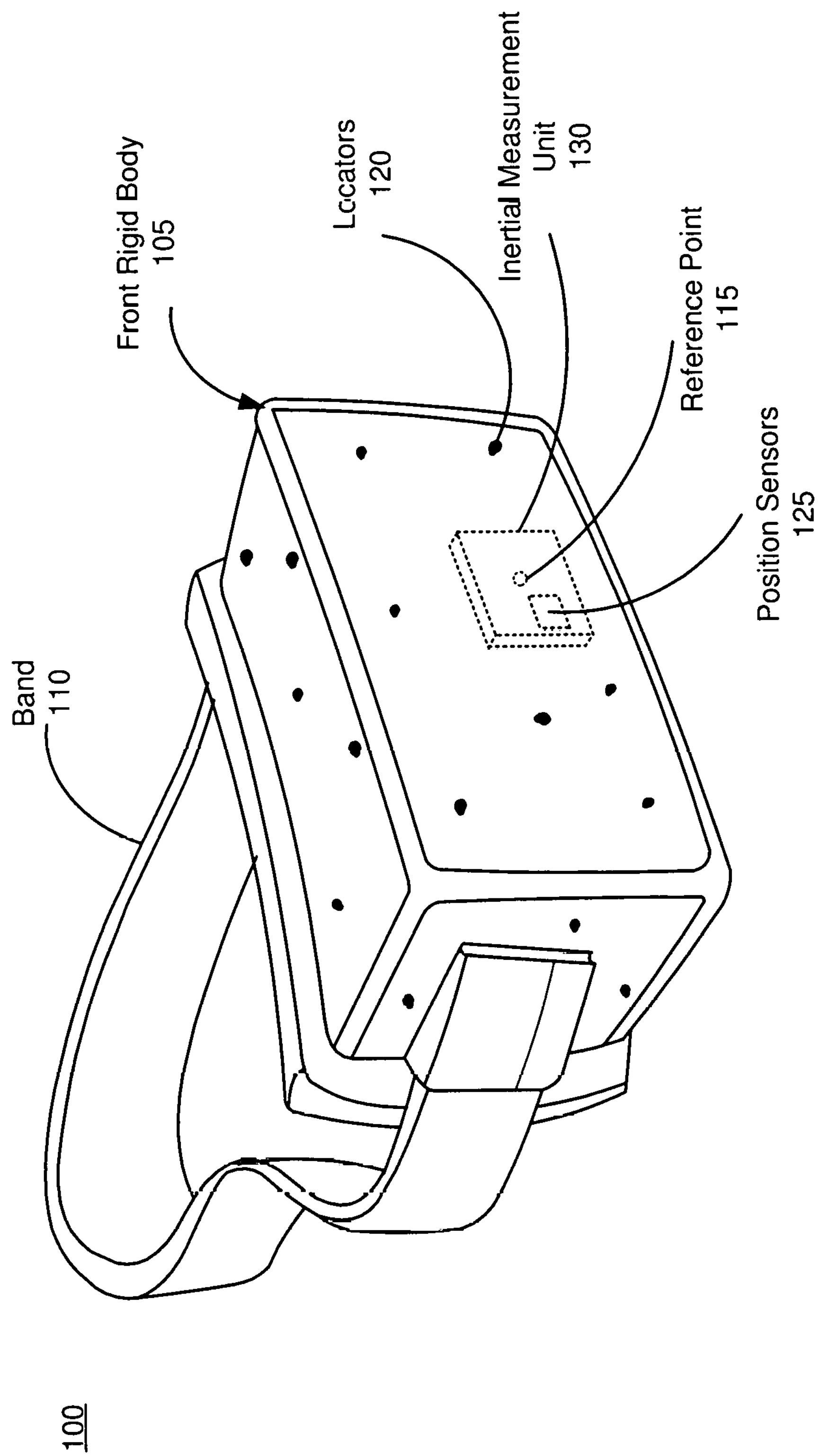
FIG. 1A is a diagram of a head-mounted display (HMD), according to one or more embodiments.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Described herein are optical elements that are integrated with light sources such as micro-LEDs for accurately tracking movement of eyes or faces. An example optical element is a lens assembly that includes a lens substrate and one or more micro-LEDs coupled to the lens substrate. The lens substrate includes one or more circuitries affixed to a surface of the lens substrate. The one or more micro-LEDs are coupled to the one or more circuitries. At least one micro-LED is affixed to a viewing region of the lens substrate. The viewing region is a region through which light emitted by an electronic display passes and reaches an eyebox. The surface of the lens substrate can have a surface profile that is flat, curved (e.g., concave, convex, etc.), freeform, or some combination thereof. The one or more circuitries are configured to supply electrical current to the one or more micro-LEDs. Multiple micro-LEDs of the one or more micro-LEDs can be switched concurrently between a light emitting state and a non-light emitting state. Each micro-LED of the one or more micro-LEDs can be switched between a light emitting state and a non-light emitting state separately.

Various embodiments may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Head-Mounted Display Overview

FIG. 1A is a diagram of a head-mounted display (HMD) 100, according to one or more embodiments. The HMD 100 is an example device 106, and includes a front rigid body 105 and a band 110. The HMD 100 includes a front rigid body 105 and a band 110. The front rigid body 105 includes an electronic display element of an electronic display (not shown in FIG. 1A), an optics block (not shown in FIG. 1A), a reference point 115, locators 120, one or more position sensors 125, and an inertial measurement unit (IMU) 130. In the embodiment shown by FIG. 1A, the position sensors 125 are located within the IMU 130, and neither the IMU 130 nor the position sensors 125 are visible to a user. In some embodiments, the HMD 100 may act as an artificial reality headset. In embodiments that describe AR system environment, the HMD 100 augments views of a physical, real-world environment with computer-generated elements (e.g., images, video, sound, etc.). For example, one or more portions of the HMD 100 may be at least partially transparent. In embodiments that describe MR system environments, the HMD 100 merges views of physical, real-word environment with virtual environment to produce new environments and visualizations where physical and digital objects co-exist and interact in real time. The reference point 115, locators 120, IMU 130, and the position sensors 125 are discussed in detail below with respect to FIG. 7.

The front rigid body 105 includes one or more electronic display elements of the display (not shown in FIG. 1A). The HMD 100 is a head-mounted display that presents media to a user. Examples of media presented by the HMD include one or more images, video, audio, or some combination thereof. The display displays images to the user in accordance with data received. The display may include one or more electronic display panels. The display includes a display block and an optics block. The display block includes one or more electronic display panels, and the optics block includes one or more optical elements that direct the image light from the display block to an eye-box of the HMD 100. The eye-box correspond to locations of the user's eyes. In some embodiments, some or all of the functionality of the display block is part of the optics block or vice versa. Example electronic display panels include: a liquid crystal display (LCD), an organic light emitting diode (OLED) display, an active-matrix organic light-emitting diode display (AMOLED), a transparent organic light emitting diode display (TOLED), some other display panels, a projector, or some combination thereof.

Figure 1B:
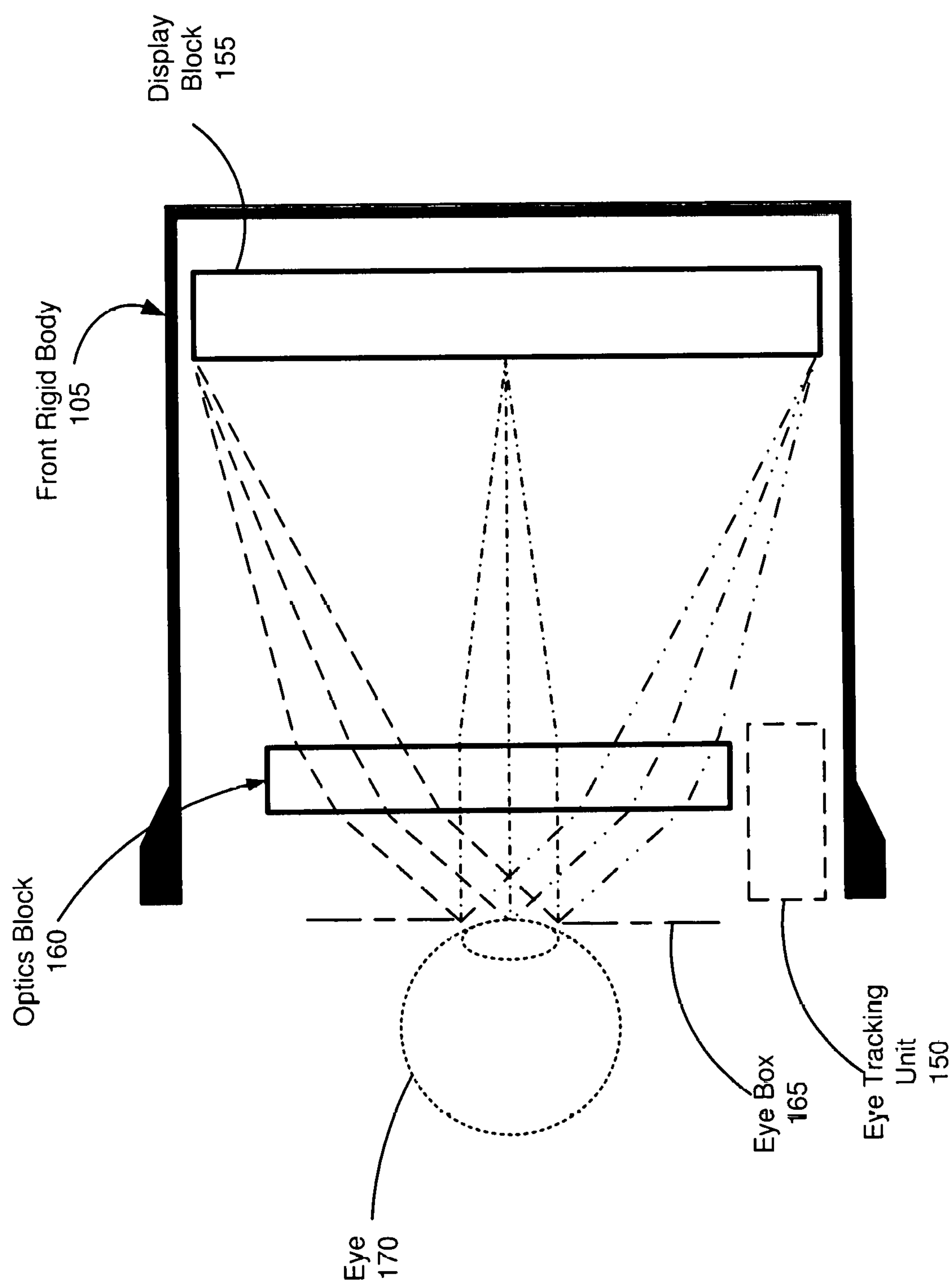
FIG. 1B illustrates a cross sectional view of the front rigid body of the HMD 100 shown in FIG. 1A, according to one or more embodiments.

FIG. 1B illustrates a cross sectional view of the front rigid body 105 of the HMD 100 shown in FIG. 1A, according to one or more embodiments. As shown in FIG. 1B, the front rigid body 105 includes a display that emits image light to an eye-box 165. The display includes a display block 155 and an optics block 160. The HMD 100 further includes an eye tracking unit 150. The eye-box 165 is a region in space that is occupied by a user's eye 170.

The micro-LED described herein refers to a micron size inorganic Light Emitting Device (ILED) device (e.g., less than 20 μm in diameter) that emits light and directionalizes its light output by collimating and/or quasi-collimating light. Directionalised light may be light that is emitted from a light generating region of a micro-LED and at least a portion of the emitted light is directed into a beam having a half angle.

The display block 155 generates image light. The display block 155 may also include display block optical elements for magnifying light and/or for minimizing pupil swim. A display block optical element may be an aperture, a Fresnel lens, a convex lens, a concave lens, a filter, a polarizer, a diffuser, a fiber taper, or any other suitable optical element that affects the image light emitted from the electronic display. In some embodiments, one or more of the display block optical elements may have one or more coatings, such as anti-reflective coatings.

The optics block 160 optically directs image light output from the display block 155 to an exit pupil 165. The optics block 160 may include at least one optical element that may be an aperture, a Fresnel lens, a convex lens, a concave lens, a filter, or any other suitable optical element that affects the image light emitted from the display block 155.

In various embodiments, the optics block 160 includes an optical element that is integrated with one or more illumination sources that are part of the eye tracking unit of the HMD 100. At least one of the one or more illumination sources is positioned within a viewing region of the optical element. As described herein, the viewing region is a region of the optical element through which the image light passes and reaches the eye box 165. The illumination sources and the coupling of the illumination sources to the optical element are further described in connection with FIGS. 2 through 4C.

Moreover, the optics block 160 may include combinations of different optical elements. In some embodiments, one or more of the optical elements in the optics block 160 may have one or more coatings, such as anti-reflective coatings. The optics block may magnify image light output from the display block 155. Magnification of the image light by the optics block 160 allows elements of the display block 155 to be physically smaller, weigh less, and consume less power than larger displays. Additionally, magnification may increase a field of view of the displayed media. For example, the field of view of the displayed media is such that the displayed media is presented using almost all (e.g., 110 degrees diagonal), and in some cases all, of the user's field of view. In some embodiments, the optics block 160 is designed so its effective focal length is larger than the spacing to the display block 155, which magnifies the image light projected by the display block 155. Additionally, in some embodiments, the amount of magnification may be adjusted by adding or removing optical elements.

The display block 155 and the optics block 160 may take on different configurations within the display.

The eye tracking unit 150 determines eye tracking information using data (e.g., images) captured by the detector of a user's eye. Eye tracking information describes a position of an eye of the user. Eye tracking information may include, e.g., gaze angle, eye orientation, inter-pupillary distance, some other metric associated with tracking an eye, or some combination thereof. Some embodiments of the eye tracking unit have different components than those described in FIG. 1B. The eye tracking unit 150 may include, e.g., one or more illumination sources such as a micro-LED that emits light to illuminate at least a portion of one or both eyes 170 of the user, one or more detectors that capture images the portion of one or both eyes 170 of the user, and a controller.

The one or more illumination sources illuminate a portion of the user's eye 170 with light. The eye tracking unit may include multiple illumination sources for illuminating one or more illuminated portions of the eye 170. As further described below, in various embodiments, an illumination source of the eye tracking unit 150 is integrated with an optical element of the optics block 160. In some embodiments, the one or more illumination sources are arranged such that the light they emit form a structured light pattern.

The detector is a device that converts light into electronic signals. The detector detects reflected and/or scattered light from the illuminated portion of the eye. The detector outputs a detection signal proportional to the detected light. The detection signal corresponds to a reflectance of the illuminated portion of the eye which correlates with an apparent contrast change (e.g., a contrast change of corneal reflection) through the illuminated portion of the user's eye 170. The spectral sensitivity of the detector may be in an infrared band or a visible band depending on the illumination source. In some embodiments, the detector may be based on single-point detection (e.g., photodiode, balanced/matched photodiodes, or avalanche photodiode), or based on one or two-dimensional detector arrays (e.g., a camera, linear photodiode array, CCD array, or CMOS array). In some embodiments, the eye tracking unit 150 may include multiple detectors to capture light reflected from one or more illuminated portions of the eye 170.

The controller determines eye tracking information using data (e.g., captured images) from the one or more detectors. For example, in some embodiments, the controller identifies locations of reflections of light from the one or more illumination sources in an image of the eye of the user, and determines a position and orientation of the eye based on the shape and/or locations of the identified reflections. In cases where the eye is illuminated with a structured light pattern, the controller can detect distortions of the structured light pattern projected onto the eye, and estimate a position and orientation of the eye based on the detected distortions. The controller can also estimate a pupillary axis, a gaze angle (e.g., corresponds to a foveal axis), a translation of the eye, a torsion of the eye, and a current shape of the eye based on the image of the illumination pattern captured by the camera.

Figure 2:
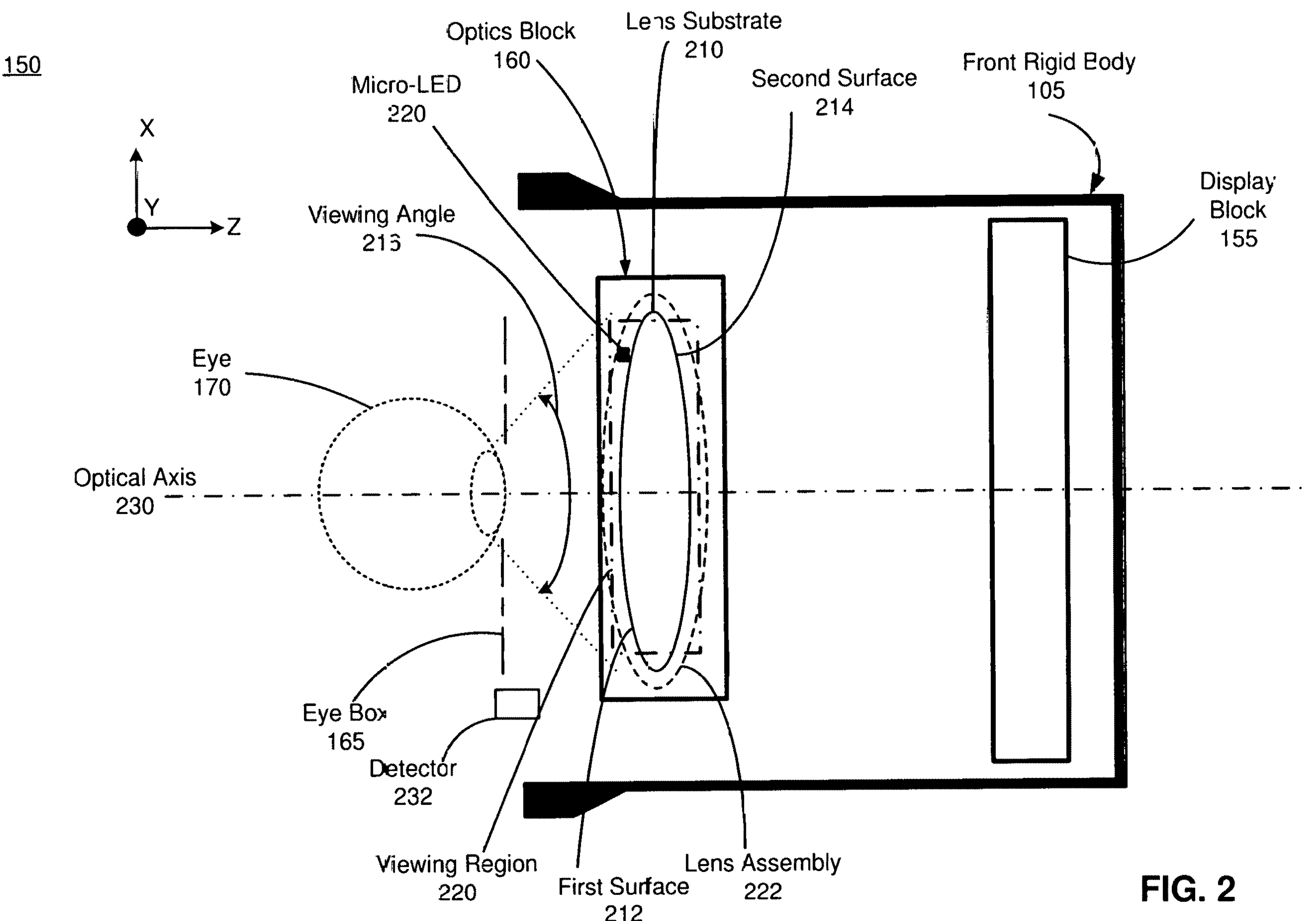
FIG. 2 is a cross-section view of a front rigid body of an HMD, according to one or more embodiments.

FIG. 2 is a cross-section view of a front rigid body of the HMD 100, according to one or more embodiments. In the illustrated system, the y direction is perpendicular to the page and coming out of the page. As described with respect to FIG. 1B, the HMD 100 includes a display block 155 and an optics block 160. The optics block 160 includes a lens assembly 222 that includes a micro-LED 220 and a lens substrate 210. The lens substrate 210 that has a first surface 212 and a second surface 214 opposite the first surface 212. The first surface 212 faces the eye-box 165, and the second surface 214 faces the display block 155. The optics block 160 directs image light emitted from the display block to the eye-box 165. Specifically, the image light pass through a region (e.g., the viewing region 220) of the lens substrate 210 prior to reaching the eye-box 165. The viewing region 220 may be a portion of the first surface 212, a portion of the entire first surface 212, a portion of the second surface 214, a portion of the entire second surface 214, or some combination thereof. The first surface 212 can be flat, curved along the x axis and/or along the y axis, or some combination thereof. In some embodiments, the first surface 212 is spherically convex shaped.

The lens substrate 210 includes one or more circuitries that are affixed to a surface of the lens substrate 210. The one or more circuitries supply electrical current to illumination sources (e.g., a micro-LED 220).

The optics block 160 includes multiple (e.g., 20, 30, etc.) micro-LEDs 220 that is affixed to the one or more circuitries that are integrated with the lens substrate 210. The micro-LEDs can be positioned linearly (e.g., a grid), nonlinearly (e.g., a ring), or some combination thereof. For illustration purposes, only one micro-LED 220 is shown in FIG. 2. In the illustrated example, the micro-LED 220 is positioned on the first surface 212. Light emitted by the micro-LED 220 reaches the eye 170 without passing through the lens substrate 210. The micro-LED 220 is positioned within the viewing region 220. That is, the micro-LED 220 is positioned on the first surface 212 of the lens substrate 210 through which the image light passes. The micro-LED 220 emits near-infrared light of a wavelength in the range of between 780 and 1100 nm (nanometer). In some embodiments, the micro-LED 220 emits light of a wavelength in the range of between 800 and 1000 nm. The micro-LED 220 has a length and a width in the range of 1 and 1000 micron. In some embodiments, the length and the width of the micro-LED 220 are each between 1 and 250 micron. In some embodiments, the length and the width of the micro-LED 220 are each between 1 and 100 micron.

In some embodiments, a micro-LED 220 uses a horizontal conductor in a flip chip. In some embodiments, a micro-LED 220 is a wire bonded LED die. In some embodiments, a micro-LED 220 is mounted on a reflective package that is mounted onto a lens substrate. The reflective package directs light emitted by a micro-LED 220 in a cone of a predetermined angle range when measured immersed in the encapsulating material (e.g., Polydimethylsiloxane (PDMS).) The predetermined angle range can be 180 degrees, 160 degrees, or 120 degrees. Reducing this angle range increases an illumination efficiency by reducing an amount of light loss within the optics block 160. Light scattered within the optics block 160 may reduce contrast and create artifacts. The angle range can be further reduced by using another optical element such as a lens or a reflector.

The micro-LED 220 emits light that reaches the eye box 165 at an angle with reference to the optical axis 230 that is within a predetermined angle range. This angle range is selected such that the light emitted by the micro-LED 220 can be reflected by the eye 170 and the reflected light can be collected by a detector 232 of an eye tracking unit thereby to capture an image of the eye 170 or a portion of the eye 170. This can be achieved in a variety of ways. In some embodiments, the micro-LED 220 is mounted to the first surface 212 such that an angle between its light emitting surface and the portion of the first surface 212 to which the micro-LED 220 is mounted is within a predetermined angle range. In some embodiments, the micro-LED 220 includes an epitaxial layer of which the geometry is structured to emit light at a predetermined angle with reference to the light emitting surface of the micro-LED 220. In some embodiments, the micro-LED 220 includes an active light emitting layer of which the geometry is structured to emit light at a predetermined angle with reference to the light emitting surface of the micro-LED 220.

In some embodiments, the micro-LED 220 is partially enclosed by an IR light absorber. The IR light absorber blocks light leakage from the micro-LED 220. That is, the IR light absorber prevents light emitted from the micro-LED 220 to propagate along predetermined directions, for example, in a direction towards the display block 155. In some embodiments, the micro-LED 220 is transparent to visible light.

The detector 232 captures images of the light emitted from the illumination sources that are reflected from the eye. For example, the reflected light may include, e.g., reflections of a structured light pattern from portions of the eye 220 (e.g., cornea, iris, and/or sclera). The detector 232 may be, e.g., an array (1D or 2D) of photodiodes, a charge coupled display (CCD) array, some other device capable of detecting some or all of the light emitted from the illumination sources, or some combination thereof. The detector 232 captures the images in accordance with tracking instructions generated by the eye tracking unit 150.

Figures 3A, 3B:
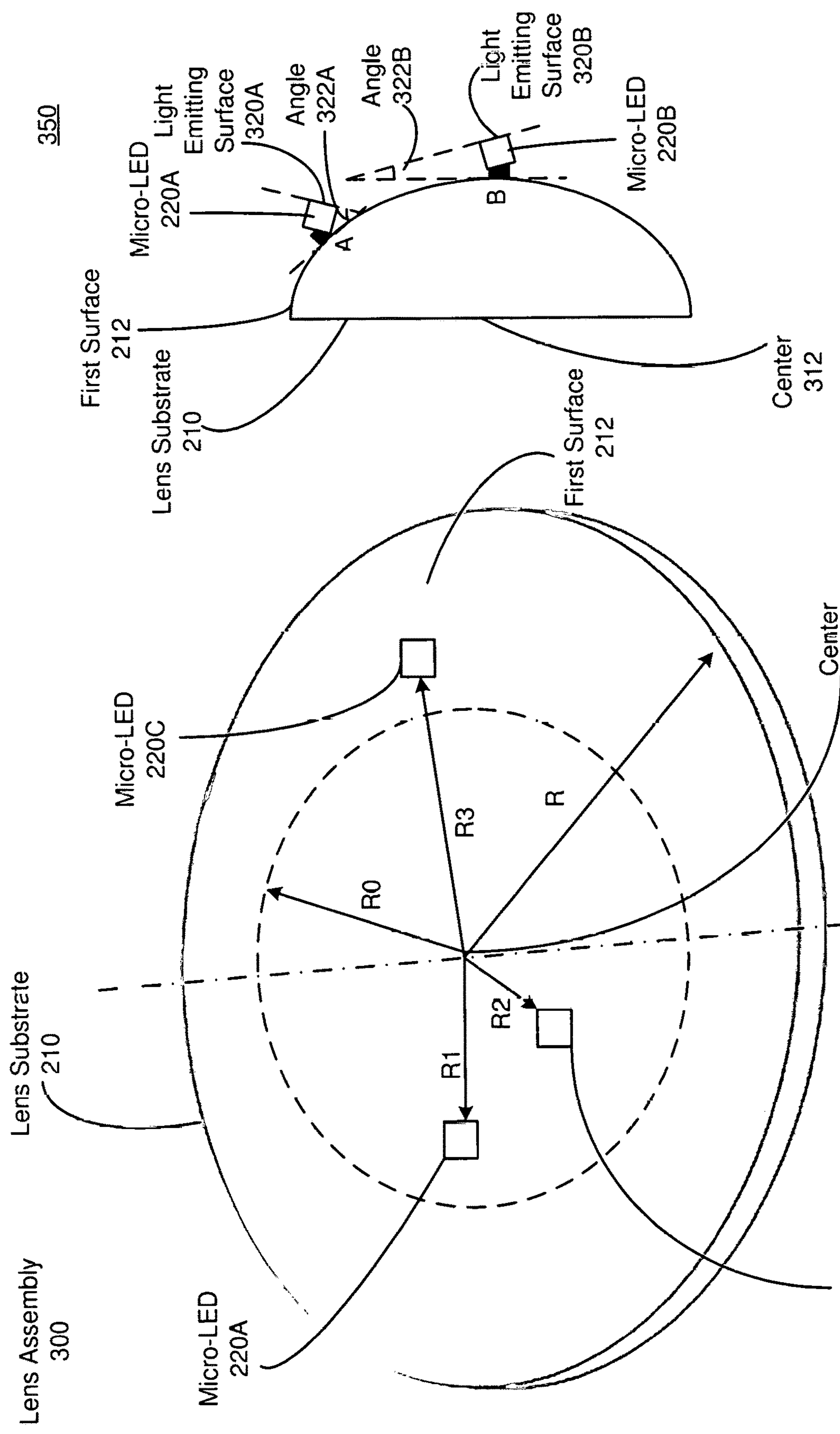
FIG. 3A is a plan view of an example lens assembly including micro-LEDs integrated with a lens substrate, according to one or more embodiments.
FIG. 3B is a side view of an example lens assembly including micro-LEDs integrated with a lens substrate, according to one or more embodiments.

FIG. 3A is a plan view of an example lens assembly 300 including a lens substrate 210 integrated with micro-LEDs (e.g., the micro-LEDs 220), according to one or more embodiments. The example lens assembly 300 includes the lens substrate 210 and three micro-LEDs 220A, 220B, and 220C that are coupled to the lens substrate 210. In other embodiments, the lens assembly 300 may include additional or fewer micro-LEDs. For example, the lens assembly 300 may include 50 micro-LEDs positioned at different locations on the lens substrate 210.

The lens substrate 210 includes one or more circuitries (not shown) that are affixed to the surface 212 of the lens substrate 210 and that are configured to supply electrical circuit to the micro-LEDs 220A, 220B, and 220C. The first surface 212 is spherically convex shaped such that it bulges outwards. The micro-LEDs 220A, 220B are positioned within a viewing region of the lens substrate 210 and the micro-LED 220C is positioned outside the viewing region of the lens substrate 210. In the illustrated example, the viewing region includes at least the convex surface from the center 312 of the first surface 212 that is defined by the radius $R_0$. The distance $R_1$ of the micro-LED 220A from the center 312 and the distance $R_2$ of the micro-LED 220A from the center 312 are less than the radius $R_0$. The distance $R_3$ of the micro-LED 220C from the center 312 is greater than the radius $R_0$. The first surface 121 has a radius of R.

FIG. 3A and the other figures use like reference numerals to identify like elements. A letter after a reference numeral, such as "220A," indicates that the text refers specifically to the element having that particular reference numeral. A reference numeral in the text without a following letter, such as "220," refers to any or all of the elements in the figures bearing that reference numeral (e.g. "220" in the text refers to reference numerals "220A" and/or "220B" in the figures).

The multiple micro-LEDs 220 can be positioned linearly, nonlinearly, or some combination thereof. For example, the micro-LEDs 220 are positioned such that they are separated from the center 312 of the lens substrate 210 by the radius $R_1$, $R_2$, $R_3$, respectively, as illustrated. The micro-LEDs 220 can be evenly, unevenly, or some combination thereof distributed on the surface 212. If the micro-LEDs 220 are evenly distributed on the surface 212, any two neighboring micro-LEDs 220 are separated by the same distance.

FIG. 3B is a side view of an example lens assembly 350 including micro-LEDs integrated with a lens substrate, according to one or more embodiments. The micro-LEDs 220A and 220B are coupled to circuitries affixed to the first surface 212 of the lens substrate 210 at locations A and B, respectively. The circuitries are not shown. The locations A and B are separated from a center of the surface 212 by different radiuses. The micro-LED 220A has a light emitting surface 320A and is mounted to the circuitries affixed to the first surface 212 at a mounting angle 322A. The mounting angle 322A is the angle between the light emitting surface 320A and the first surface 212 at the location A. The micro-LED 220B has a light emitting surface 320B and is mounted to the circuitries affixed to the first surface 212 at a mounting angle 322B. The mounting angle 322B is the angle between the light emitting surface 320B and the first surface 212 at the location B. The angles 322A and 322B are different as illustrated such that light emitted by the micro-LEDs 220A and 220B reach a user's eye at an angle that is within a predetermined angle range. The angles are selected based in part on a location of the detector 232.

Figure 4A:
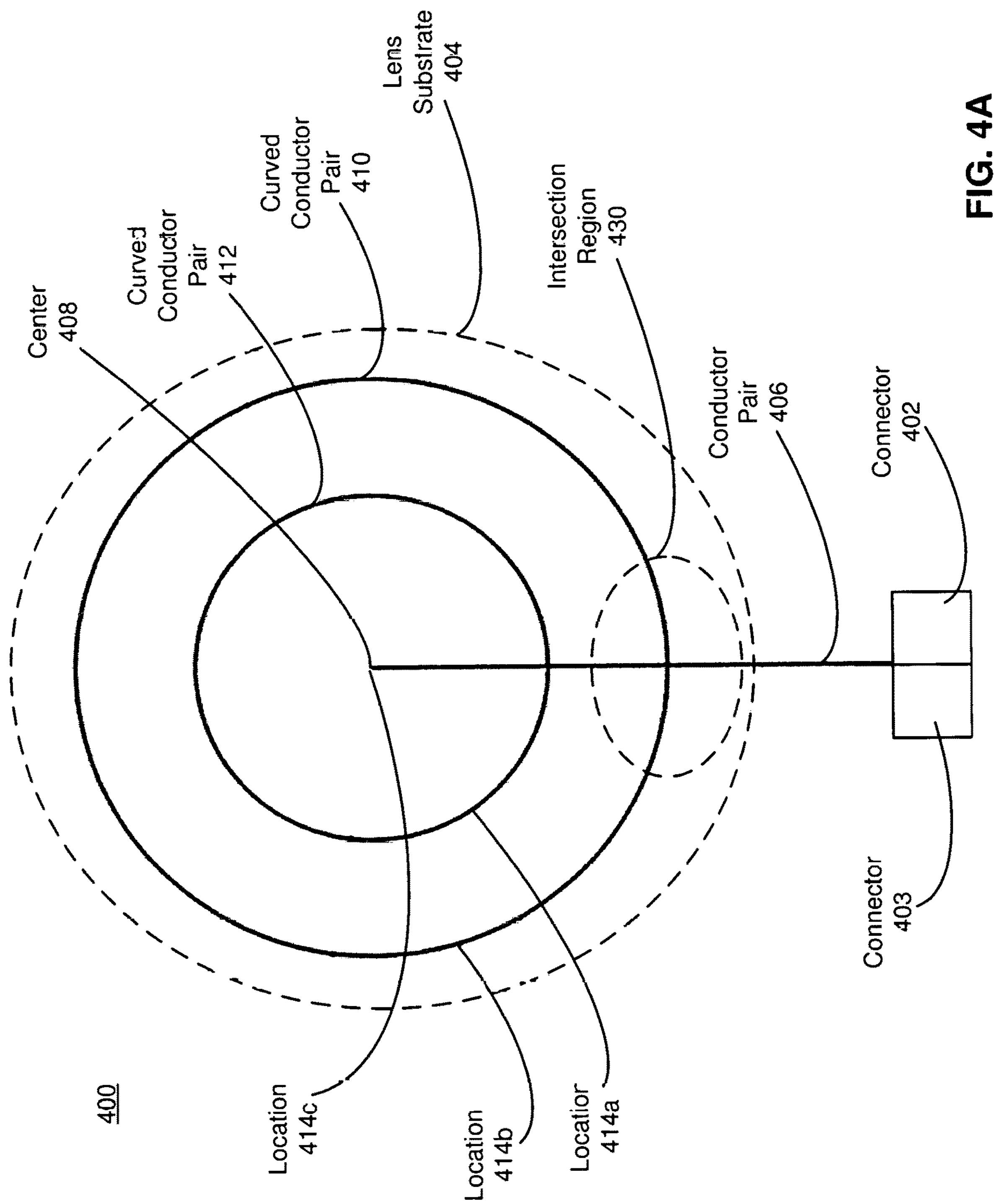
FIG. 4A is a front view of an example circuitry for supplying electrical current for driving micro-LEDs integrated with a lens, according to one or more embodiments.

FIG. 4A is a front view of an example circuitry 400 for supplying electrical current for driving micro-LEDs that are integrated with a lens substrate 404, according to one or more embodiments. The circuitry 400 can be integrated with a lens substrate 404 and one or more micro-LEDs are affixed onto the circuitry 400. A center of the circuitry 400 is aligned to a center 408 of the lens substrate 404. The center of the lens preferably is aligned to a center of a user's view at the eye's relaxed gaze angle.

The circuitry 400 includes a pair of connectors (e.g., connectors 402, 403), a conductor pair (e.g., a conductor pair 406), and one or more curved conductor pairs (e.g., curved conductor pairs 410, 412). A conductor pair includes a pair of conductors (not shown) that can be shaped in various shapes. A curved conductor pair includes a pair of curved conductors (not shown). The curved conductors are shaped in curvilinear shapes such as a ring as illustrated. The curved conductors 410, 412 have different dimensions (e.g., radiuses from the center 408) and are electrically connected to the conductor pair 406 at different locations.

The pair of connectors 402, 403 is configured to be coupled to a power source. The connectors 402 and 403 are electrically insulated from each other. The conductor pair 406 is configured to supply electrical current to a micro-LED and/or to one or more curved conductor pairs from the pair of connectors 402, 403. One conductor of the conductor pair 406 is electrically coupled to the connector 402 and the other conductor of the conductor pair 406 is electrically coupled to the connector 403. However, the conductors in the conductor pair 406 are not directly connected to each other. A curved conductor pair can supply electrical current to one or more micro-LEDs that are connected to the curved conductor pair. Of each curved conductor pair, one conductor is electrically connected to the connector 402 via the conductor pair 406, and the other conductor is electrically connected to the connector 403 via the conductor pair 406.

Multiple micro-LEDs can be electrically connected to the circuitry 400 at various locations of the circuitry 400. An individual micro-LED is electrically coupled to the conductor pair 406 or one of the curved conductor pair. For example, a micro-LED can be connected to the conductor pair 406 at the location 414*c*, to the curved conductor pair 412 at the location 414*a*, or to the curved conductor pair 410 at the location 414*b*. A micro-LED is electrically coupled to the conductors of the conductor pair. The p-contact of the micro-LED is electrically coupled to one conductor of the conductor pair and the n-contact of the micro-LED is electrically coupled to the other conductor. The multiple micro-LEDs can be concurrently controlled between a light emitting state and a non-light emitting state by controlling connecting or disconnecting the connectors 402, 403 to the power source.

Figure 4B:
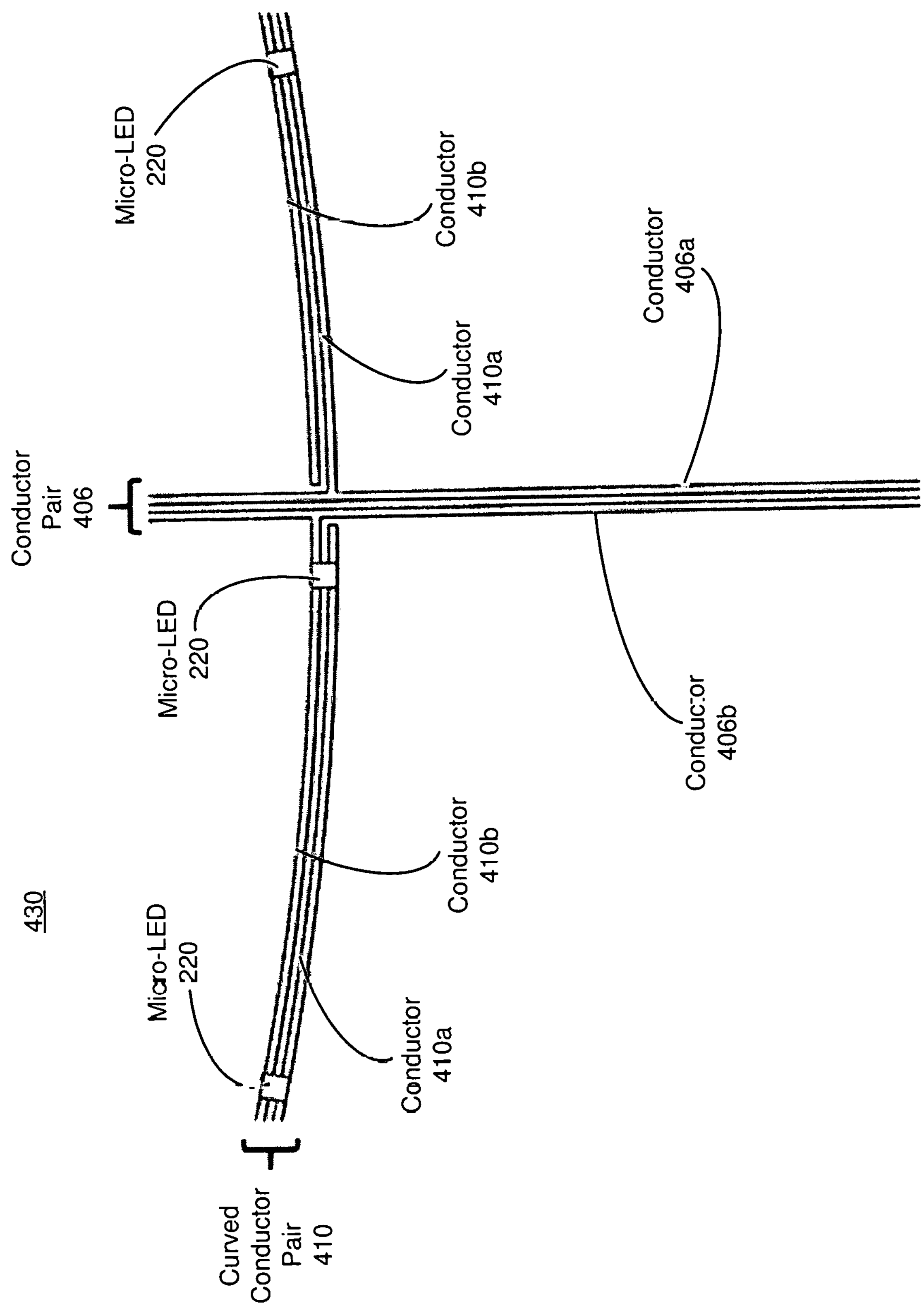
FIG. 4B is an enlarged view of an example circuitry for supplying electrical current for driving micro-LEDs integrated with a lens, according to one or more embodiments.

FIG. 4B is an enlarged view 430 of an example circuitry for supplying electrical current for driving micro-LEDs integrated with a lens, according to one or more embodiments. The enlarged view 430 is of the intersection between the conductor pair 406 and the curved conductor pair 410. The conductor pair 406 includes conductors 406*a*, 406*b*, and the curved conductor pair 410 includes conductors 410*a*, 410*b*. The conductor 410*a* is connected to the conductor 406*a* and the conductor 410*b* is connected to the conductor 410*b*. Micro-LEDs 220 are connected to the curved conductor pair 410. The micro-LEDs 220 are coupled across the conductors 410*a*, 410*b*. In some embodiments, the p-contact of the micro-LED 220 is electrically coupled to the conductor 410*a* and the n-contact of the micro-LED 220 is electrically coupled to the other conductor 410*b*.

Figure 4C:
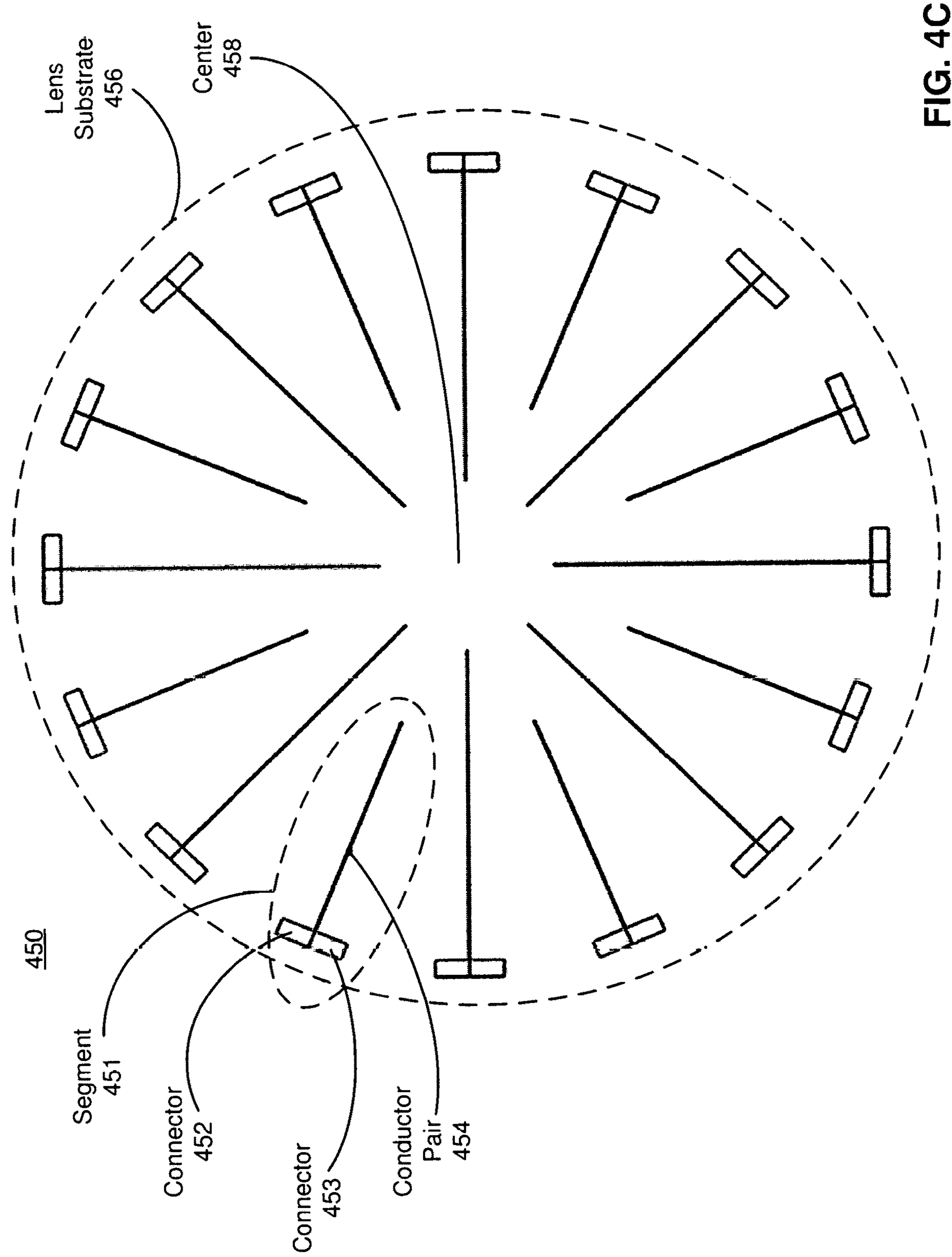
FIG. 4C is a front view of an example circuitry for supplying electrical current for driving micro-LEDs integrated with a lens, according to one or more embodiments.

FIG. 4C is a front view of an example circuitry 450 for supplying electrical current for driving micro-LEDs that are integrated with a lens substrate 456, according to one or more embodiments. The circuitry 400 can be integrated with a lens to form a lens substrate onto which one or more micro-LEDs are affixed. A center 458 of the circuitry 400 is aligned to a center of the lens. The center of the lens preferably is aligned to a center of a user's view at the eye's relaxed gaze angle.

The circuitry 450 includes multiple separate segments 451. A segment 451 includes a pair of connectors 452, 453, and a conductor pair 454. The connectors 452, 453 and the conductor pair 454 are similar to the connectors 402, 403 and the conductor pair 406 illustrated in FIG. 4A, respectively. Thus, description of these elements is omitted. The conductor pairs of the segments 451 can be of a uniform length or different lengths. The segments 451 are preferably evenly distributed such that any two neighboring segment are separated by the same distance.

Multiple micro-LEDs can be electrically connected to the circuitry 450. An individual micro-LED can be electrically connected to a conductor pair of the circuitry 450. Multiple micro-LEDs can be electrically connected to one conductor pair. Micro-LEDs connected to different segments can be independently controlled between a light emitting state and a non-light emitting state by controlling connecting or disconnecting the connectors for each particular segment to a power source. Micro-LEDs connected to a particular segment can be concurrently controlled between a light emitting state and a non-light emitting state by controlling connecting or disconnecting the connectors for the segment to a power source.

The circuitry 450 has the advantage of reducing power consumption. Because micro-LEDs can be connected to different segments, the circuitry 450 allows selectively switching off some of the micro-LEDs affixed to a lens such as those are not needed for eye tracking while keeping the rest micro-LEDs on for eye tracking.

Circuitries for supplying current to micro-LEDs include conductors that can be made of various materials such as metal (e.g., aluminum, copper, silver, nickel, gold, or alloys thereof), transparent conductive oxides (e.g., indium tin oxide, zinc oxide) or other conductors that are transparent to visible light, transparent polymers (e.g., Poly(3,4-ethylenedioxythiophene) (PEDOT)), or nanoparticulate metal including ink. A metal conductor can be transparent and have a thickness less than a threshold thickness (e.g., about 50 nm.) A conductor can also include a nanowire made of silver or other suitable materials.

With respect to light in a visible band, a conductor can be transparent, opaque, partially transparent, or some combination thereof. A transparent conductor can be based on a multilayered structure that includes a transparent conductive oxide layer and a metal layer having a thickness less than a threshold thickness. A circuitry can include transparent, opaque, and/or partially transparent conductors. An opaque conductor can be positioned outside the viewing region of a lens. A transparent conductor can be positioned within the viewing region.

Circuitries that include metal materials can be manufactured using subtractive or additive processes. Additive processes can produce metal conductors of higher aspect ratios, compared to subtractive processes. The aspect ratio of a conductor is the ratio of a thickness to a width of the conductor. In various embodiments, an aspect ratio of a conductor included in a circuitry is at least a threshold aspect ratio. The threshold aspect ratio can be 0.2, 0.5, or 1.

Example Micro-LED

Figure 5A:
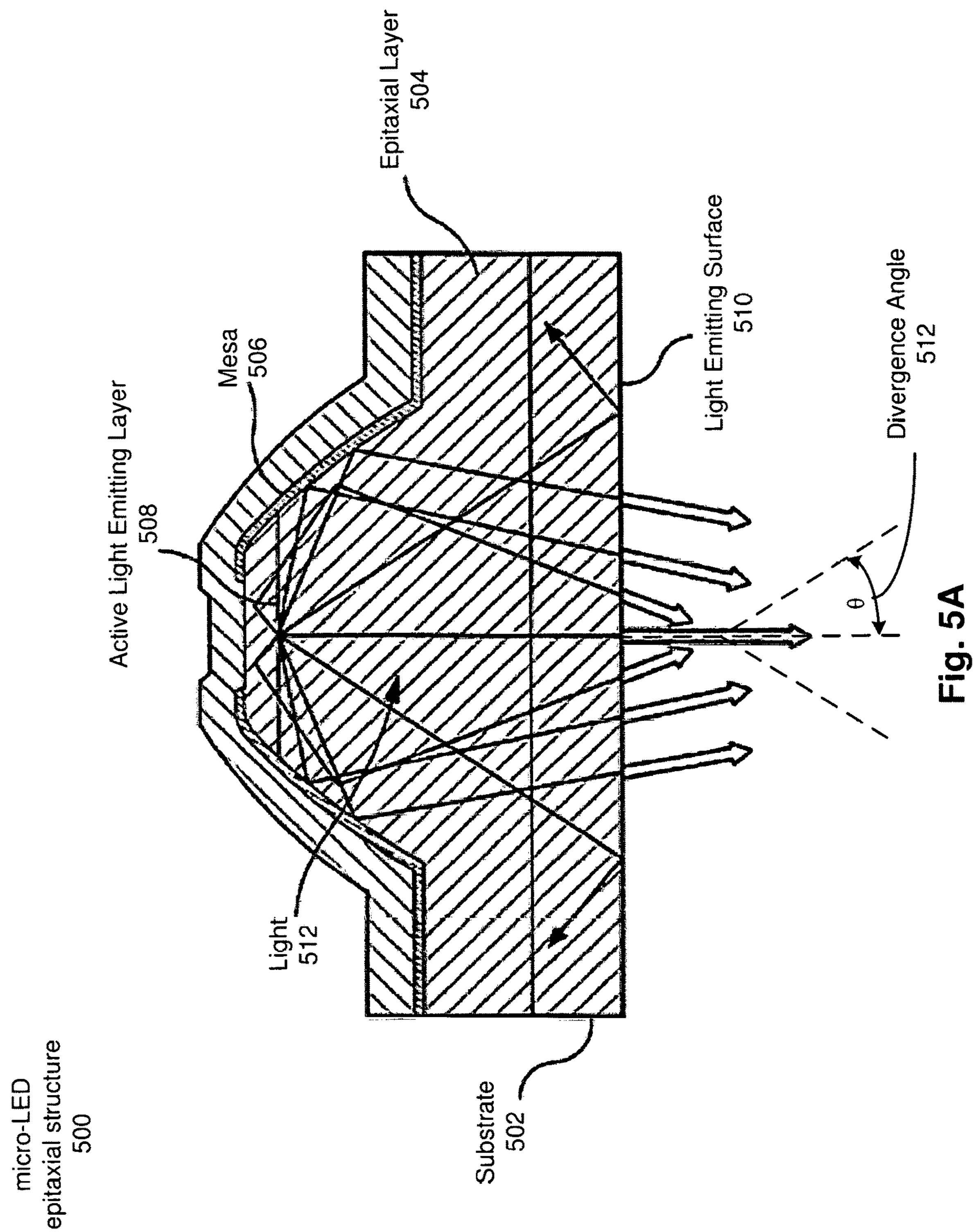
FIG. 5A is a cross sectional view of a micro-LED, according to one or more embodiments.

FIG. 5A is a cross sectional view of a micro-LED epitaxial structure 500, according to one or more embodiments. The micro-LED 500 may include, among others, a substrate 502, an epitaxial layer 504 shaped into a mesa 506, an active light emitting layer 508, and a light emitting surface 510. The micro-LED 500 may be less than 20 μm in diameter with a parabolic structure etched onto the LED die during wafer processing to form a quasi-collimated light beam emerging from the light emitting surface 510. The micro-LED 500 includes high light extraction efficiency and outputs quasi-collimated light because of its shape. The micro-LED 500 can be configured to emit light having a divergence angle θ in a predetermined range. In various embodiments, the divergence angle θ is in the range of between 10 and 25 degrees.

The epitaxial layer 504 is disposed on the substrate 502. The active light emitting layer 508 is enclosed in the mesa 506. The mesa 506 has a truncated top, on a side opposed to the light emitting region 510. The mesa 506 has a curved or near-parabolic shape to form a reflective enclosure for light within the micro-LED 500. The arrows 512 show how light emitted from the active light emitting layer 508 is reflected off the walls of the mesa 506 toward the light emitting region 510 at an angle sufficient for the light to escape the micro-LED 500 (e.g., within the angle of total internal reflection). The p- and n-contacts (not shown) are located on the same side as the mesa 506, which is opposite the light emitting surface 510.

This structure of the micro-LED 500 results in an increase in the efficiency of light emission when compared to unshaped or standard LED chips. As such, the micro-LED 500 produces light visible to the human eye with reduced current (e.g., nano-amps of drive current).

Figure 5B:
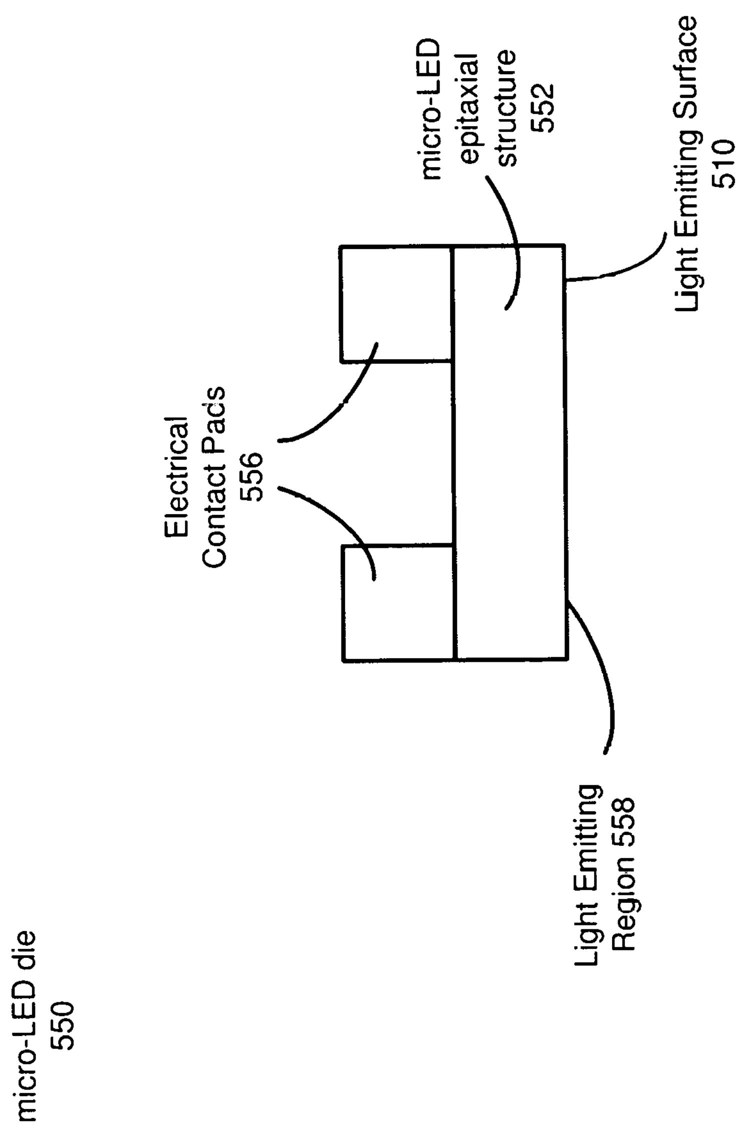
FIG. 5B is a cross sectional view of an LED die, according to one or more embodiments.

FIG. 5B is a cross sectional view of a micro-LED die 550, according to one or more embodiments. The micro-LED die 550 may include, among others, a micro-LED epitaxial structure 552 and electrical contact pads 556. The micro-LED epitaxial structure 552 may be the micro-LED epitaxial structure 500 shown in FIG. 5A, or may be a different type of micro-LED epitaxial structure. The electrical contact pads 556 serve as interconnects for the micro-LED die 550 when the micro-LED die 550 is mounted to a lens substrate.

The electrical contact pads 556 are provided in the form of bumps or microbumps, for interconnection of the micro-LED die 550 to an electrical conductor. The electrical contact pads are arranged on the top surface of the micro-LED epitaxial structure 557 and are on top of the p- and n-contacts of the micro-LED epitaxial structure 552, which are arranged on a single side of the micro-LED epitaxial structure 552 opposite to the light emission surface 510. The electrical contact pads 556 include a metal, e.g. CuSn or Cu, to permit interconnection to corresponding metal pads, e.g. Cu pads, on the electrical conductor. If the micro-LED epitaxial structure 552 is transferred onto the electrical conductor, the electrical contact pads 556 are in temporary metal to metal contact with the corresponding metal pads. The temporary metal to metal contact between the electrical contact pads 556 and the corresponding metal pads on the electrical conductor may permit testing of the LED 552 in a pre-bond state, i.e. temporary bond state. Testing of the micro-LED dies 550 does not require the micro-LED dies 550 being permanently bonded to the electrical conductor.

Figure 6A:
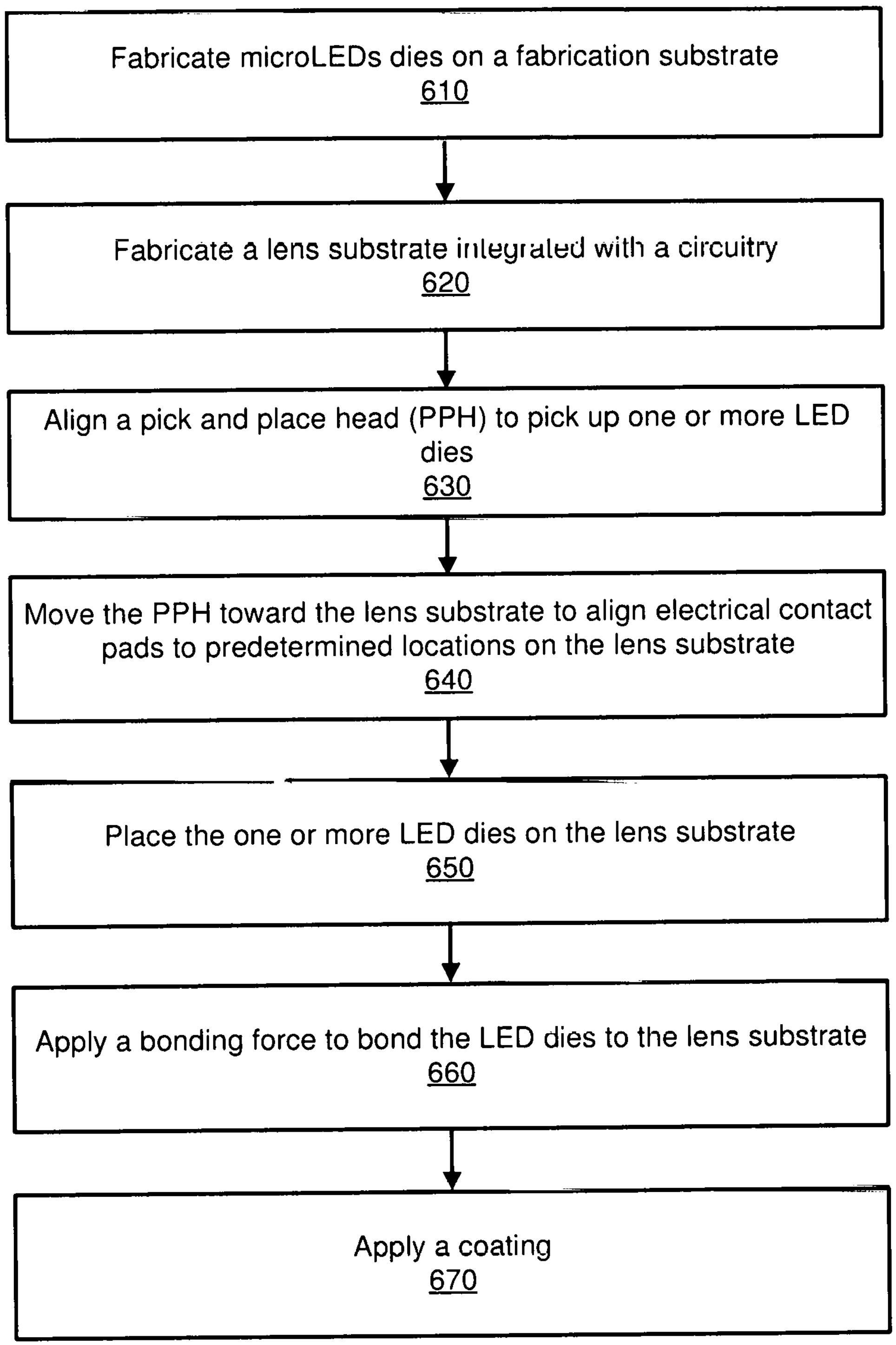
FIG. 6A illustrates an example process of manufacturing a lens assembly integrated with one or more LEDs, according to one or more embodiments.

FIG. 6A illustrates an example process of manufacturing a lens assembly including a lens substrate integrated with one or more LEDs, according to one or more embodiments. The process of FIG. 6A may be performed by a lens assembly fabrication system such as the lens assembly fabrication system 672 illustrated in FIG. 6B. Other entities may perform some or all of the steps of the process in other embodiments. Likewise, embodiments may include different and/or additional steps, or perform the steps in different orders. The lens assembly fabrication system can perform a plurality of placement cycles (e.g. pick, place, test).

The lens assembly fabrication system fabricates 610 micro-LED dies on a fabrication substrate. Alternatively, the lens assembly fabrication system may receive a fabrication substrate that includes micro-LED dies fabricated thereon. The "lens assembly fabrication system" is also referred to herein as the "fabrication system." In some embodiments, the lens assembly fabrication system places the fabrication substrate onto a carrier substrate (e.g., a mechanical layer) that acts as a handle layer for subsequent processing steps. A micro-LED die is positioned on the carrier substrate such that electrical pads of the micro-LED die are in contact with the carrier substrate. The fabrication system removes the fabrication substrate from the micro-LED dies. The fabrication system singulates the micro-LED dies. Alternatively, the fabrication system deposits a conformal intermediate layer onto a top surface of the micro-LED dies and partially singulates the micro-LED dies. The top surface of a micro-LED die is opposite the electrical contact pads.

The fabrication system fabricates 620 a lens substrate. The lens substrate includes a lens integrated with one or more circuitries for supplying electrical current to micro-LEDs. A circuitry includes one or more conductors and one or more pairs of contacts (e.g., metal pads). The one or more pair of contacts are electrically connected to the one or more conductors. A pair of contacts is for electrically coupling a micro-LED to the one or more conductors. The lens may be made of glass, plastic, or other materials that are transmissive to light. Alternatively, the fabrication system receives a lens substrate. The fabrication system places the lens substrate onto a target stage that supports the lens substrate for subsequent processing steps.

The fabrication system aligns 630 a pick and place head (PPH) to pick up one or more LED dies from the carrier substrate. The PPH is a flat non-elastomeric head, which if applied to the micro-LED dies (e.g., the intermediate layer), forms a conformal contact with the micro-LED dies, which enables the micro-LED dies to be picked up from the carrier substrate and transferred to the lens substrate. The PPH may be made from plastic, glass, silicon or other materials. The PPH includes one or more dimples protruding for picking up one or more micro-LEDs.

The fabrication system moves 640 the PPH toward the lens substrate to align electrical contact pads of the one or more micro-LED dies to predetermined locations (e.g., corresponding electrical contacts) on the lens substrate.

The fabrication system places 650 the one or more micro-LED dies on the lens substrate. The fabrication system can adjust the PPH to place a micro-LED onto the lens substrate at a particular angle. The fabrication system removes the PPH from the one or more micro-LED dies after the micro-LED dies onto the lens substrate. The electrical contact pads of the one or more micro-LED dies are in contact with the electrical contacts on the lens substrate. In some embodiments, the fabrication system tests the micro-LED dies in the pre-bond state.

The fabrication system applies 660 a bonding force to bond the LED dies to the lens substrate. The fabrication system controls a bonding head such as a thermocompression bonding head to contact the micro-LED dies and to apply a thermal compression force to create a permanent bond between the micro-LED dies and the lens substrate. The thermocompression force creates reflow of the electrical contacts of the micro-LED dies or metallic interdiffusion, e.g., Solid Liquid interdiffusion (SLID). SLID involves an excitation source, such as a thermal, compression or ultrasonic forces to create a permanent bond. For example, the fabrication system may use a thermocompression bonding head in the form of a drum to provide a compressive force and a thermal transfer configured to activate the electrical contacts of the LED dies. The drum may be rolled across the one or more LED dies to bond them to the lens substrate.

The fabrication system applies 670 a coating over the micro-LEDs and the lens substrate. The coating can planarize the micro-LED dies. The coating can also secure the micro-LED dies to the lens substrate. The coating includes one or more layer of clear materials such as poly(methyl methacrylate) (PMMA), urethanes, polydimethylsiloxane (PDMS), or poly(methyl phenyl silicone). Compared to polydimethylsiloxane (PDMS), poly(methyl phenyl silicone) is used to reduce water vapor transmission.

Example of a Lens Assembly Fabrication System

Figure 6B:
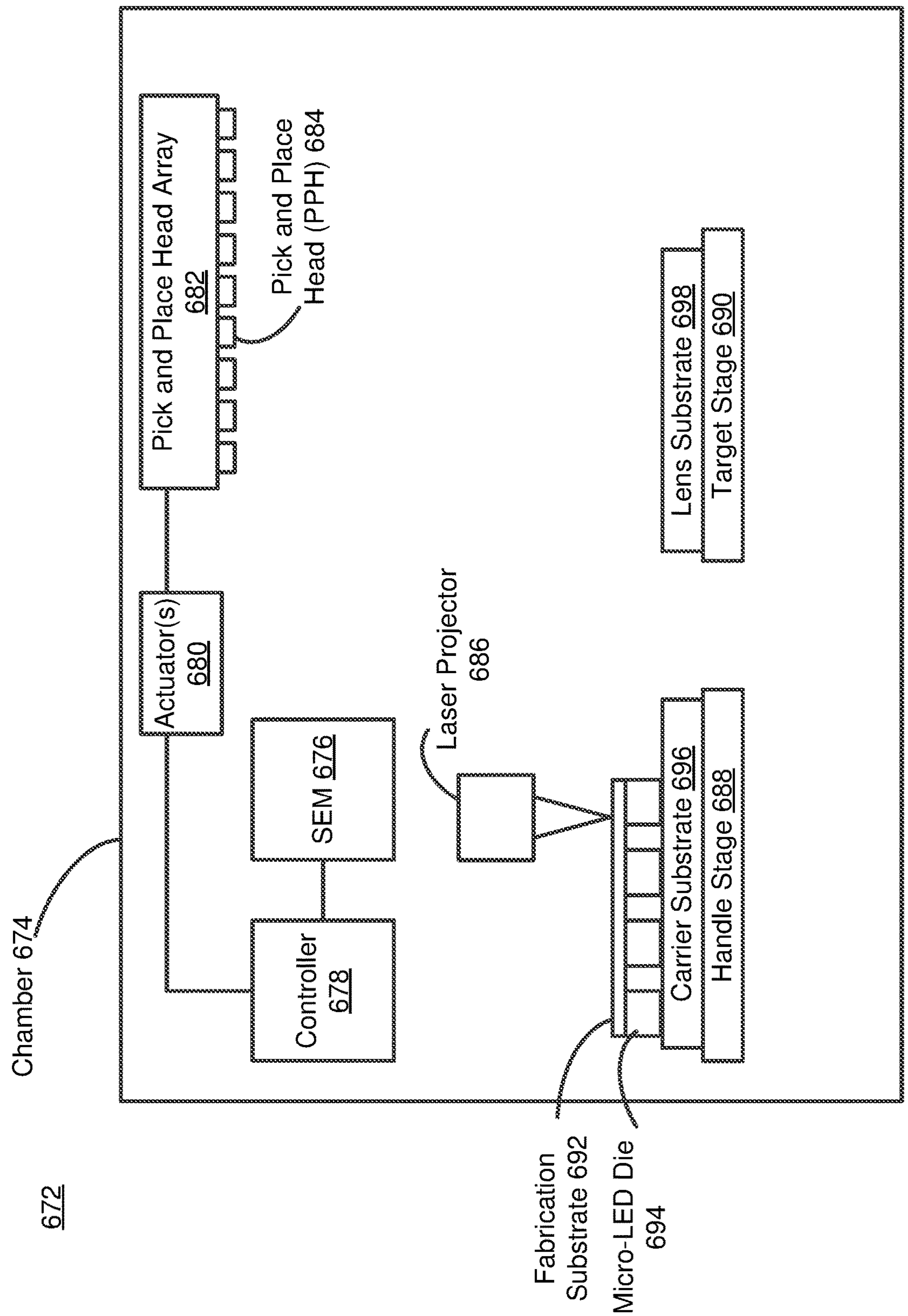
FIG. 6B is a diagram illustrating an example lens assembly fabrication system according to one or more embodiments.

FIG. 6B is a block diagram illustrating a lens assembly fabrication system 672, according to one or more embodiments. The fabrication system 672 fabricates a lens assembly by assembling micro-LED dies 694 from a fabrication substrate 692 to a lens substrate 698. The micro-LED dies 694 can be the micro-LED 220 illustrated in FIGS. 2 through 4B and the micro-LED die 550 illustrated in FIG. 5B.

The fabrication system 672 includes a chamber 674 for defining an interior environment for picking and placing micro-LED dies 694 within the chamber 674. The fabrication system 672 includes a pick and place head (PPH) array 682, a scanning electron microscope (SEM) 676, an actuator 680, a handle stage 688, a carrier substrate 696, a lens substrate 698, a target stage 690, and a laser projector 686, all of which are housed by the chamber 674. The fabrication system 674 may also include other components such as a probing device or a mechanical dicer that are housed within the chamber 674 such as a probing device.

The fabrication substrate 692 is a layer of material (e.g., glass, sapphire, or semiconductor materials such as GaAs, Gallium phosphide (GaP), or silicon) where the micro-LED dies 694 are fabricated. A semiconductor layer (e.g., a gallium semiconductor layer) may be grown onto the fabrication substrate 692 for forming the micro-LED dies 694. For example, the fabrication substrate 692 can be the substrate 502 illuminated in FIG. 5A.

The carrier substrate 696 is a temporary substrate for transferring micro-LED dies 694 from the fabrication substrate 692 to the lens substrate 698. The fabrication substrate 692 is removed after the micro-LED dies 694 are attached to the carrier substrate 696. After the fabrication substrate 692 is removed, the carrier substrate 696 holds the Micro-LED dies 694 for pick up by the PPH array 682.

The handle stage 688 supports the carrier substrate 696. In one embodiment, the position of the handle stage 688 can be adjusted with three degrees of freedom including left and right, backward and forward, and a yaw rotational degree of freedom. Because the carrier substrate 696 is moved with the handle stage 688, moving the handle stage 688 facilitates the carrier substrate 696 to be precisely aligned to the PPH array 682.

The lens substrate 698 is where the micro-LED dies 694 are finally placed. The lens substrate 698 includes integrated electrical circuitries. The fabrication system 672 places micro-LED dies 694 at predetermined locations on the lens substrate 698. The electrical contact pads of the micro-LED dies 694 are attached to traces or electrical contacts of the lens substrate 698, for example, using thermocompression (TC) bonding. The fabrication system 672 can place the micro-LED dies 694 onto the lens substrate 698 at a predetermined angle.

In some embodiments, before bonding the micro-LED dies 694 to the lens substrate 698, the fabrication system 672 tests operations of the micro-LED dies 694. For example, a probing device drives the micro-LED dies 694 to emit light to identify defective devices (e.g., not emitting light when being turned on, or emitting light when turned off).

The target stage 690 supports the lens substrate 698. Similar to the handle stage 688, the position of the target stage 690 can also be adjusted with three degrees of freedom. Because the lens substrate 698 is moved with the target stage 690, moving the target stage 690 facilitates the lens substrate 698 to be precisely aligned to the PPH array 682. In some embodiments, the target stage 690 includes a heater for TC bonding of the electrical contact pads of the micro-LED dies 112 to the electrical contacts or traces of the lens substrate 698.

A pick-up tool (PUT) transfers the micro-LED dies 694 from the carrier substrate 696 to the lens substrate 698. The PUT may include, among other components, the controller 678, the SEM 676, the actuator(s) 132, and the PPH array 682.

The PPH array 682 is configured to be attached to the micro-LED dies 694 and then to release the micro-LED dies 694. The PPH array 682 includes a plurality of PPHs 684 each of which is configured to be attached to a micro-LED die 694. The PPH array 682 can be configured to release the micro-LED dies 694 onto the lens substrate 698 at a predetermined angle.

Positions of the PPH array 682 can be adjusted. A position of the PPH array 682 can be adjusted to be aligned to a location for picking up the micro-LED dies 694 or for placing the micro-LED dies 694. The movement of the PPH array 682 is controlled by the actuators 680.

The actuator 680 is an electro-mechanical component that controls the movement of the PPH array 682. For example, the actuator 680 moves the PPII array 682, or individual PPHs 684, with three degrees of freedom including up and down, left and right, and forward and back. The actuator 680 may be embodied, for example, as a rotating motor, a linear motor or a hydraulic cylinder. The actuator 680 operates according to instructions from the controller 678.

The controller 678 generates instructions to control operations of the actuator 680 thereby to control the movement the PPH array 682. For example, the controller 678 generates instructions for the actuator 680 to align the PPH array 682 to the carrier substrate 696 thereby to pick up the micro-LED dies 694, and to align the PPII array 682 to the lens substrate 698 to place the micro-LED dies 694. The controller 678 generates instructions according to images generated by the SEM 676. For example, based on the images of the PPH array 682 and the carrier substrate 696 (or the lens substrate 698), the controller 678 generates instructions to cause the actuator 680 to move the PPH array 682 to be aligned to the carrier substrate 696 (or the lens substrate 698). In addition, the controller 678 controls operations of the SEM 676. The controller 678 controls the SEM 676 to capture images and to provide the captured images to the controller 678. As illustrated, the controller 678 is coupled to the PPH array 682 (e.g., via the actuator 680) and to the SEM 676. The controller 678 may include a non-transient computer readable storage medium (e.g., DRAM) for storing instructions of PUT components and a processor for executing these instructions.

The SEM 676 facilitates aligning the PPH array 682 to a location. The SEM 676 captures images of the PPH array 682 and a location (e.g., a carrier substrate 696 and a lens substrate 698) and provides the images to the controller 678 according to the instructions received from the controller 678. In some embodiments, the SEM 676 is an environmental scanning electron microscope (ESEM) to capture images without specimen coating. The chamber 674 is an ESEM chamber including a high pressure atmosphere of water vapor. The use of an SEM is advantageous for picking up and placing small semiconductor devices, such as micro-LED dies. Other types of imaging devices may be used to facilitate the alignment.

The laser projector 686 projects a laser to perform laser liftoff (LLO) for detaching the fabrication substrate 692 from the micro-LED dies 694. In some embodiments, the laser passes through the fabrication substrate 692 and reach the micro-LED dies 694, in particular, the semiconductor layer of the micro-LED dies 694. The semiconductor layer absorbs the laser beam. The absorption weakens the bond between the semiconductor layer and the fabrication substrate 692 thereby separating the micro-LED dies 694 from the fabrication substrate 692. The laser projected by the laser projector 686 is of a wavelength selected according to the material of the fabrication substrate 692. For example, for fabrication substrates 692 made of sapphire, the laser projector 686 projects a pulse ultraviolet laser. For fabrication substrates 692 made of GaAs, the laser projector 686 projects an infrared (IR) laser. In other embodiments, the laser projector 686 projects the laser at the junction of the fabrication substrate 692 and the micro-LED dies 694. In these cases, the projected laser does not pass through the fabrication substrate 692 because the fabrication substrate 692 is made of a material not substantially transparent to the laser projected by the laser projector 686.

In some embodiments, another laser (not shown) generates a laser beam to singulate the micro-LED dies 694. In some embodiments, the laser beam is directed through the carrier substrate 696. In some embodiments, the fabrication system 672 includes a mechanical dicer to singulate the micro-LED dies 694, such as a diamond based cutting wheel.

Example of an Artificial Reality System

Figure 7:
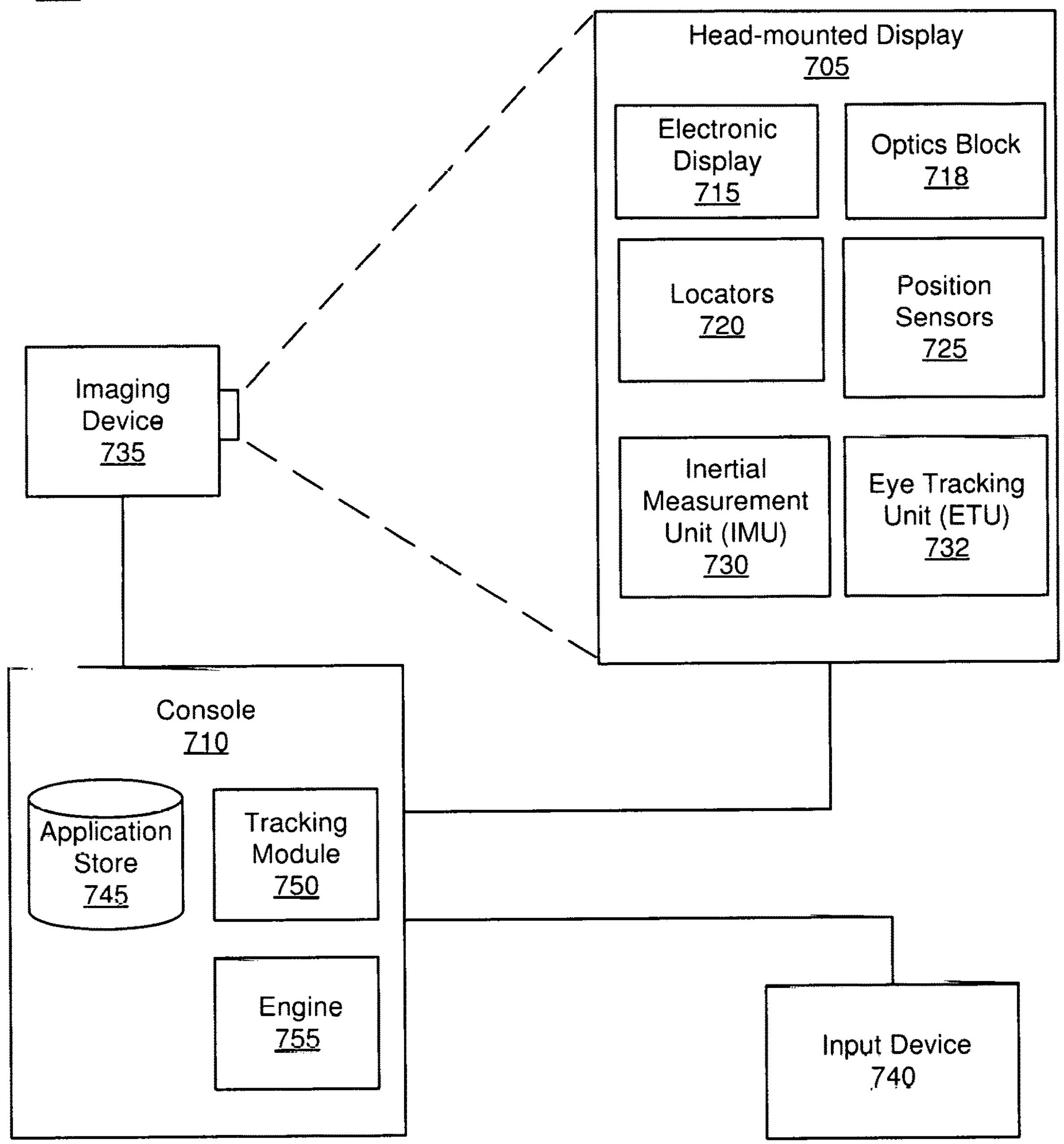
FIG. 7 is a block diagram of an example artificial reality system, according to one or more embodiments.

FIG. 7 is a block diagram of an example artificial reality system 700 in which an HMD 705 operates. The system 700 shown by FIG. 7 comprises a HMD 705, an imaging device 735, and an interface device 740 that are each coupled to the console 710. While FIG. 7 shows an example system 700 including one HMD 705, one imaging device 735, and one interface device 740, in other embodiments any number of these components may be included in the system 700. For example, there may be multiple HMDs 705 each having an associated interface device 740 and being monitored by one or more imaging devices 735, with each HMD 705, interface device 740, and imaging devices 735 communicating with the console 710. In alternative configurations, different and/or additional components may be included in the system 700. Similarly, functionality of one or more of the components can be distributed among the components in a different manner than is described here. For example, some or all of the functionality of the console 710 may be contained within the HMD 705.

The HMD 705 presents content to a user. In some embodiments, the HMD 705 is the HMD 100. Examples of content presented by the HMD 705 include one or more images, video, audio, or some combination thereof. In some embodiments, audio is presented via an external device (e.g., speakers and/or headphones) that receives audio information from the HMD 705, the console 710, or both, and presents audio data based on the audio information. The HMD 705 may comprise one or more rigid bodies, which may be rigidly or non-rigidly coupled to each other together. A rigid coupling between rigid bodies causes the coupled rigid bodies to act as a single rigid entity. In contrast, a non-rigid coupling between rigid bodies allows the rigid bodies to move relative to each other. In some embodiments, the HMD 705 may present VR, AR, MR, or some combination thereof to a user. In the AR and/or MR embodiments, the HMD 705 may augment views of a physical, real-world environment with computer-generated elements (e.g., images, video, sound, etc.).

The HMD 705 includes an electronic display 715, an optics block 718, one or more locators 720, one or more position sensors 725, an inertial measurement unit (IMU) 730, and an eye tracking unit (ETU) 732. Some embodiments of the HMD 705 have different components than those described here. Similarly, the functions can be distributed among other components in the system 700 in a different manner than is described here. For example, some of the functions of the optics block 718 may be performed by the console 710. The electronic display 715 displays images to the user in accordance with data received from the console 710.

The optics block 718 includes an optical element integrated with one or more micro-LEDs. The one or more micro-LEDs are a part of the eye tracking unit 732. The optical element includes one or more circuitries that are affixed to a surface of the optical element and are configured to supply electrical current to the one or more micro-LEDs. The one or more micro-LEDs are coupled to the one or more circuitries. At least one micro-LED is positioned within a viewing region of the optical element.

The eye tracking unit 732 tracks a user's eye movement. The eye tracking unit 731 includes a light source to project light onto a portion of the user's eye, and a detector to collect reflected and/or scattered light from the illuminated portion of the eye. In various embodiments, the light source includes the one or more micro-LEDs coupled to the optical element included in the optics block 718. The eye tracking unit uses the tracked eye movement to determine one or more characterization parameters such as an orientation of the eye (i.e., an angle of eye-gaze and eye-gaze location). Based on the detected eye movement, the eye tracking unit communicates with the console 710 for further processing. The console 710 can adjust focus of the displayed images, which mitigates vergence-accommodation conflict (VAC) associated with the image light. The console 710 can perform foveated rendering of the displayed images, based on the determined orientation of the user's eye. In this case, the console 710 may provide a maximum pixel density only in a foveal region of the user's eye-gaze, while a lower pixel resolution can be used in other regions.

In some embodiments, the eye tracking unit 732 allows a user to interact with content presented to the user by the console 710 based on the detected eye movement. Example interactions by the user with presented content include: selecting a portion of content presented by the console 710 (e.g., selecting an object presented to the user), movement of a cursor or a pointer presented by the console 710, navigating through content presented by the console 710, presenting content to the user based on a gaze location of the user, or any other suitable interaction with content presented to the user.

In some embodiments, the optics block 718 includes one or more additional optical elements. Examples of the optical element include an aperture, a Fresnel lens, a convex lens, a concave lens, reflective element, a filter, or any other suitable optical element that affects the image light emitted from the electronic display 715. Moreover, the optics block 718 may include combinations of different optical elements. In some embodiments, one or more of the optical elements in the optics block 718 may have one or more coatings, such as partial reflectors or anti-reflective coatings.

The locators 720 are objects located in specific positions on the HMD 705 relative to one another and relative to a specific reference point on the HMD 705. A locator 720 may be a light emitting diode (LED), a corner cube reflector, a reflective marker, a type of light source that contrasts with an environment in which the HMD 705 operates, or some combination thereof. In embodiments where the locators 720 are active (i.e., an LED or other type of light emitting device), the locators 720 may emit light in the visible band (~380 nm to 750 nm), in the infrared (IR) band (~750 nm to 1700 nm), in the ultraviolet band (200 nm to 380 nm), some other portion of the electromagnetic spectrum, or some combination thereof.

In some embodiments, the locators 720 are located beneath an outer surface of the HMD 705, which is transparent to the wavelengths of light emitted or reflected by the locators 720 or is thin enough not to substantially attenuate the wavelengths of light emitted or reflected by the locators 720. Additionally, in some embodiments, the outer surface or other portions of the HMD 705 are opaque in the visible band of wavelengths of light. Thus, the locators 720 may emit light in the IR band under an outer surface that is transparent in the IR band but opaque in the visible band.

The IMU 730 is an electronic device that generates fast calibration data based on measurement signals received from one or more of the position sensors 725. A position sensor 725 generates one or more measurement signals in response to motion of the HMD 705. Examples of position sensors 725 include: one or more accelerometers, one or more gyroscopes, one or more magnetometers, another suitable type of sensor that detects motion, a type of sensor used for error correction of the IMU 730, or some combination thereof. The position sensors 725 may be located external to the IMU 730, internal to the IMU 730, or some combination thereof.

Based on the one or more measurement signals from one or more position sensors 725, the IMU 730 generates fast calibration data indicating an estimated position of the HMD 705 relative to an initial position of the HMD 705. For example, the position sensors 725 include multiple accelerometers to measure translational motion (forward/back, up/down, left/right) and multiple gyroscopes to measure rotational motion (e.g., pitch, yaw, and roll). In some embodiments, the IMU 730 rapidly samples the measurement signals and calculates the estimated position of the HMD 705 from the sampled data. For example, the IMU 730 integrates the measurement signals received from the accelerometers over time to estimate a velocity vector and integrates the velocity vector over time to determine an estimated position of a reference point on the HMD 705. Alternatively, the IMU 730 provides the sampled measurement signals to the console 710, which determines the fast calibration data. The reference point is a point that may be used to describe the position of the HMD 705. While the reference point may generally be defined as a point in space; however, in practice the reference point is defined as a point within the HMD 705 (e.g., a center of the IMU 130).

The IMU 730 receives one or more calibration parameters from the console 710. As further discussed below, the one or more calibration parameters are used to maintain tracking of the HMD 705. Based on a received calibration parameter, the IMU 730 may adjust one or more IMU parameters (e.g., sample rate). In some embodiments, certain calibration parameters cause the IMU 730 to update an initial position of the reference point so it corresponds to a next calibrated position of the reference point. Updating the initial position of the reference point at the next calibrated position of the reference point helps reduce accumulated error associated with the determined estimated position. The accumulated error, also referred to as drift error, causes the estimated position of the reference point to "drift" away from the actual position of the reference point over time.

The imaging device 735 generates slow calibration data in accordance with calibration parameters received from the console 710. Slow calibration data includes one or more images showing observed positions of the locators 720 that are detectable by the imaging device 735. The imaging device 735 may include one or more cameras, one or more video cameras, any other device capable of capturing images including one or more of the locators 720, or some combination thereof. Additionally, the imaging device 735 may include one or more hardware and software filters (e.g., used to increase signal to noise ratio). The imaging device 735 is configured to detect light emitted or reflected from locators 720 in a field of view of the imaging device 735. In embodiments where the locators 720 include passive elements (e.g., a retroreflector), the imaging device 735 may include a light source that illuminates some or all of the locators 720, which retro-reflect the light towards the light source in the imaging device 735. Slow calibration data is communicated from the imaging device 735 to the console 710, and the imaging device 735 receives one or more calibration parameters from the console 710 to adjust one or more imaging parameters (e.g., focal length, focus, frame rate, ISO, sensor temperature, shutter speed, aperture, etc.).

The interface device 740 is a device that allows a user to send action requests to the console 710. An action request is a request to perform a particular action. For example, an action request may be to start or end an application or to perform a particular action within the application. The interface device 740 may include one or more input devices. Example input devices include: a keyboard, a mouse, a game controller, or any other suitable device for receiving action requests and communicating the received action requests to the console 710. An action request received by the interface device 740 is communicated to the console 710, which performs an action corresponding to the action request. In some embodiments, the interface device 740 may provide haptic feedback to the user in accordance with instructions received from the console 710. For example, haptic feedback is provided when an action request is received, or the console 710 communicates instructions to the interface device 740 causing the interface device 740 to generate haptic feedback when the console 710 performs an action.

The console 710 provides content to the HMD 705 for presentation to the user in accordance with information received from one or more of: the imaging device 735, the HMD 705, the interface device 740, and the eye tracking unit included in the optics block 718. In the example shown in FIG. 1, the console 710 includes an application store 745, a tracking module 750, and an engine 755. Some embodiments of the console 710 have different modules than those described in conjunction with FIG. 1. Similarly, the functions further described below may be distributed among components of the console 710 in a different manner than is described here.

The application store 745 stores one or more applications for execution by the console 710. An application is a group of instructions, that when executed by a processor, generates content for presentation to the user. Content generated by an application may be in response to inputs received from the user via movement of the HMD 705, the interface device 740, or the eye tracking unit included in the optics block 718. Examples of applications include: gaming applications, conferencing applications, video playback application, or other suitable applications.

The tracking module 750 calibrates the system 700 using one or more calibration parameters and may adjust one or more calibration parameters to reduce error in determination of the position of the HMD 705. For example, the tracking module 750 adjusts the focus of the imaging device 735 to obtain a more accurate position for observed locators on the HMD 705. Moreover, calibration performed by the tracking module 750 also accounts for information received from the IMU 730. Additionally, if tracking of the HMD 705 is lost (e.g., the imaging device 735 loses line of sight of at least a threshold number of the locators 720), the tracking module 750 re-calibrates some or all of the system 700.

The tracking module 750 tracks movements of the HMD 705 using slow calibration information from the imaging device 735. The tracking module 750 determines positions of a reference point of the HMD 705 using observed locators from the slow calibration information and a model of the HMD 705. The tracking module 750 also determines positions of a reference point of the HMD 705 using position information from the fast calibration information. Additionally, in some embodiments, the tracking module 750 may use portions of the fast calibration information, the slow calibration information, or some combination thereof, to predict a future location of the HMD 705. The tracking module 750 provides the estimated or predicted future position of the HMD 705 to the engine 755.

The engine 755 executes applications within the system 700 and receives position information, acceleration information, velocity information, predicted future positions, or some combination thereof of the HMD 705 and eye tracking unit included in the optics block 718 from the tracking module 750. Based on the received information, the engine 755 determines content to provide to the HMD 705 for presentation to the user. For example, if the received information indicates that the user has looked to the left, the engine 755 generates content for the HMD 705 that mirrors the user's movement in a virtual environment. Similarly, if information received from the eye tracking unit indicates the user gazing on a location, the engine 755 generates content based on the identified gazing location, such as a visual representation of the scene at the gazing location with an original display resolution and surrounding scenes with a reduced display resolution. Additionally, in some embodiments, if the received information indicates that tracking of the eye tracking unit is lost, the engine 755 generates content indicating the HMD 705 is to be adjusted for presentation by the HMD 705. Additionally, the engine 755 performs an action within an application executing on the console 710 in response to an action request received from the interface device 740, or the eye tracking unit and provides feedback to the user that the action was performed. The provided feedback may be visual or audible feedback via the HMD 705 or haptic feedback via the interface device 740. For example, the engine 755 receives an action from the eye tracking unit to open an application, so the engine 755 opens the application and presents content from the application to the user via the HMD 705.

In some embodiments, the engine 755 can be configured to utilize, in association with the console 710 and the HMD 705, the eye tracking information obtained from the eye tracking unit 732 for a variety of display and interaction applications. The various applications include, but are not limited to, providing user interfaces (e.g., gaze-based selection), attention estimation (e.g., for user safety), gaze-contingent display modes (e.g., foveated rendering, varifocal optics, adaptive optical distortion correction, synthetic depth of field rendering), metric scaling for depth and parallax correction (e.g., IPD and eye-box adjustment), etc. In some embodiments, based on information about position and orientation of the user's eye received from the eye tracking unit 732, the engine 755 determines resolution of the content provided to the HMD 705 for presentation to the user on the electronic display 715. The engine 755 provides the content to the HMD 705 having a maximum pixel density (maximum resolution) on the electronic display 715 in a foveal region of the user's gaze, whereas the engine 755 provides a lower pixel resolution in other regions of the electronic display 715, thus achieving less power consumption at the HMD 705 and saving computing cycles of the console 710 without compromising a visual experience of the user. In some embodiments, the engine 755 can be configured to optimize the performance of other components of the optics block 718 of the HMD 705 based on the eye tracking information obtained from the eye tracking unit. In one embodiment, the engine 755 can adjust optical distortion correction parameters of other components of the optics block 718, e.g., to prevent vergence-accommodation conflict. In an alternate embodiment, the engine 755 can adjust focus of images displayed on the electronic display 715, e.g., to prevent vergence-accommodation conflict.

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A lens assembly comprising:

a lens substrate including a first surface and a second surface opposite the first surface, the first surface including a viewing region through which light from an electronic display passes prior to reaching an eyebox; and a plurality of micro-LEDs coupled to one or more circuitries affixed to the first surface, the plurality of micro-LEDs including:

a first micro-LED positioned within the viewing region at a first location of the first surface such that a first light emitting surface of the first micro-LED is mounted at a first mounting angle, the first mounting angle is an angle between the light emitting surface of the first micro-LED and the first surface at the first location, and a second micro-LED positioned within the viewing region at a second location of the first surface such that a second light emitting surface of the second micro-LED is mounted at a second mounting angle, the second mounting angle is an angle between the light emitting surface of the second micro-LED and the first surface at the second location, wherein the first mounting angle is different from the second mounting angle.

2. The lens assembly of claim 1, wherein at least one micro-LED of the plurality of micro-LEDs is positioned outside the viewing region.

3. The lens assembly of claim 1, wherein a portion of the one or more circuitries is transparent in a visible band of light and overlaps the viewing region.

4. The lens assembly of claim 1, wherein a portion of the one or more circuitries is opaque in a visible band of light and is outside the viewing region.

5. The lens assembly of claim 1, wherein the one or more circuitries comprise a pair of conductors, and wherein the plurality of micro-LEDs are coupled to the pair of conductors, a p-contact of each of the plurality of micro-LEDs electrically connected to a first conductor of the pair and a n-contact of each of the plurality of micro-LEDs connected to the second conductor of the pair.

6. The lens assembly of claim 5, wherein the plurality of micro-LEDs are concurrently switched between a light emitting state and a non-light emitting state by connecting or disconnecting the pair of conductors to a power source.

7. The lens assembly of claim 1, wherein the one or more circuitries comprise a first pair of conductors and a second pair of conductors and the first micro-LED is electrically coupled to the first pair of conductors, and the second micro-LED is electrically coupled to the second pair of conductors.

8. The lens assembly of claim 7, wherein the first micro-LED is switched between a light emitting state and a non-light emitting state independent from the second micro-LED being switched between a light emitting state and a non-light emitting state.

9. The lens assembly of claim 1, wherein the first surface has a flat surface profile.

10. The lens assembly of claim 1, wherein the first surface has a curved surface profile.

11. The lens assembly of claim 1, wherein the plurality of micro-LEDs includes a micro-LED, and light emitted from the micro-LED reaches the eyebox without passing through the lens substrate.

12. The lens assembly of claim 1, further comprising a coating layer that is transparent in a visible band, the coating layer at least partially enclosing at least some of the plurality of micro-LEDs and the lens substrate.

13. The lens assembly of claim 1, wherein the plurality of micro-LEDs are configured to emit light having a wavelength in a near-infrared range.

14. The lens assembly of claim 1, wherein a width of a micro-LED, of the plurality of micro-LEDs, is between 1 and 1000 microns and a length of the micro-LED is between 1 and 1000 microns.

15. A head mounted display (HMD), comprising:

a lens assembly comprising:

a lens substrate including a first surface and a second surface opposite the first surface, the first surface including a viewing region through which light from an electronic display passes prior to reaching an eyebox, and a plurality of micro-LEDs coupled to one or more circuitries affixed to the first surface, the plurality of micro-LEDs including:

a first micro-LED positioned within the viewing region at a first location of the first surface such that a first light emitting surface of the first micro-LED is mounted at a first mounting angle, the first mounting angle is an angle between the light emitting surface of the first micro-LED and the first surface at the first location, and a second micro-LED positioned within the viewing region at a second location of the first surface such that a second light emitting surface of the second micro-LED is mounted at a second mounting angle, the second mounting angle is an angle between the light emitting surface of the second micro-LED and the first surface at the second location, wherein the first mounting angle is different from the second mounting angle; and an eye tracking unit comprising:

a detector configured to record reflected light directly, the reflected light being emitted by the plurality of micro-LEDs and reflected or scattered by an object positioned at the eyebox.

16. The HMD of claim 15, wherein the plurality of micro-LEDs includes a micro-LED positioned outside the viewing region.

17. The HMD of claim 15, further comprising a coating layer that is transparent in a visible band, the coating layer at least partially enclosing at least some of the plurality of micro-LEDs and the lens substrate.

18. The HMD of claim 15, wherein a portion of the one or more circuitries is transparent in a visible band of light and overlaps the viewing region.

19. The HMD of claim 15, wherein a portion of the one or more circuitries is opaque in a visible band of light and is outside the viewing region.

20. The lens assembly of claim 1, wherein both the first mounting angle and the second mounting angle are based in part on a location of a detector, wherein the detector is configured to capture light emitted by the first micro-LED and the second micro-LED which is reflected by an eye in the eyebox toward the detector.

* * * * *